United States Patent
Kozakai et al.

(10) Patent No.: US 12,265,203 B2
(45) Date of Patent: Apr. 1, 2025

(54) ANTIREFLECTIVE MEMBER, AND POLARIZING PLATE, IMAGE DISPLAY DEVICE AND ANTIREFLECTIVE ARTICLE EACH EQUIPPED WITH SAME

(71) Applicant: DAI NIPPON PRINTING CO., LTD., Tokyo (JP)

(72) Inventors: Tatsuya Kozakai, Okayama (JP); Tomoyuki Horio, Tsukuba (JP); Michiaki Takei, Okayama (JP); Osamu Watanabe, Okayama (JP); Keisuke Endou, Kashiwa (JP); Takanobu Tadaki, Tsukuba (JP); Kio Mizuno, Kuki (JP); Atsushi Washio, Tsukuba (JP); Keita Iwahara, Okayama (JP); Sho Suzuki, Okayama (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 767 days.

(21) Appl. No.: 17/420,943

(22) PCT Filed: Jan. 10, 2020

(86) PCT No.: PCT/JP2020/000590
§ 371 (c)(1),
(2) Date: Jul. 6, 2021

(87) PCT Pub. No.: WO2020/145373
PCT Pub. Date: Jul. 16, 2020

(65) Prior Publication Data
US 2022/0091303 A1    Mar. 24, 2022

(30) Foreign Application Priority Data

Jan. 10, 2019 (JP) ................................. 2019-002904
Mar. 29, 2019 (JP) ................................. 2019-067731

(51) Int. Cl.
*G02B 1/111* (2015.01)
*G02B 5/30* (2006.01)

(52) U.S. Cl.
CPC ............ *G02B 1/111* (2013.01); *G02B 5/3025* (2013.01)

(58) Field of Classification Search
CPC ............................................ G02B 1/11–1/118
See application file for complete search history.

(56) References Cited

U.S. PATENT DOCUMENTS

2007/0047087 A1* 3/2007 Fukuda ............... G02B 5/0294
                                                    359/582
2012/0200933 A1* 8/2012 Akiyama ............. G02B 5/0247
                                                    359/601

(Continued)

FOREIGN PATENT DOCUMENTS

| CN | 103299217 | 9/2013 |
| JP | 2000-147209 | 5/2000 |

(Continued)

OTHER PUBLICATIONS

Machine translation of KR20120002863. Retrieved Feb. 21, 2024.*

(Continued)

*Primary Examiner* — Prashant J Khatri
(74) *Attorney, Agent, or Firm* — HSML P.C.

(57) ABSTRACT

To provide an antireflection member which not only has a low reflectance, but also is enhanced in scratch resistance, and an image display device comprising the antireflection member. An antireflection member 100 comprising a low refractive index layer 130 on a transparent substrate 110, in which the low refractive index layer 130 includes a binder resin and silica particles 132 and 134, a ratio of Si element attributed to the silica particles, obtained by analysis of a surface region of the low refractive index layer 130 by X-ray photoelectron spectroscopy, is 10.0 atomic percent or more (Continued)

and 18.0 atomic percent or less and a ratio of C element under the assumption that the ratio of Si element is defined to be 100 atomic percent is 180 atomic percent or more and 500 atomic percent or less.

11 Claims, 2 Drawing Sheets

(56) References Cited

U.S. PATENT DOCUMENTS

| 2013/0329297 | A1 | 12/2013 | Hayashi et al. | |
| 2018/0106929 | A1* | 4/2018 | Song | B05D 3/067 |
| 2018/0231688 | A1* | 8/2018 | Byun | C08J 7/044 |
| 2020/0284948 | A1* | 9/2020 | Byun | G02B 1/111 |

FOREIGN PATENT DOCUMENTS

| JP | 2007-078711 | | 3/2007 |
| JP | 2008-107792 | | 5/2008 |
| JP | 2015-183168 | | 10/2015 |
| JP | 6011527 B2 | | 10/2016 |
| JP | 2018-533068 | | 11/2018 |
| JP | 2018-533762 | | 11/2018 |
| JP | 2018-535440 | | 11/2018 |
| KR | 20120002863 A | * | 1/2012 |
| WO | 2009-001723 | | 12/2008 |
| WO | 2012/157682 | | 11/2012 |

OTHER PUBLICATIONS

International Search Report of PCT/JP2020/000590, Mar. 17, 2020, 5 pages including English translation.
The extended European search report issued for European Patent Application No. 20738793.7, Aug. 12, 2022, 7 pages.

* cited by examiner

ANTIREFLECTIVE MEMBER, AND POLARIZING PLATE, IMAGE DISPLAY DEVICE AND ANTIREFLECTIVE ARTICLE EACH EQUIPPED WITH SAME

TECHNICAL FIELD

The present invention relates to an antireflection member, and a polarizing plate, an image display device and an antireflective article each comprising the antireflection member.

BACKGROUND ART

It is known that antireflection members are provided on device surfaces in, for example, display devices such as liquid crystal display devices, organic EL display devices and micro LED display devices, and showcases, for the purpose of an improvement in visibility. In recent years, not only televisions but also touch panel type image display devices, for example, in-car displays such as car navigation equipment, tablets, and smartphones, which are operated by direct contact of hands of users with screens, are widespread, and antireflection members have also been provided on such devices.

Known methods for producing antireflection members include a method involving laminating an inorganic thin film different in refractive index as an antireflection layer on a hardcoat layer provided on a transparent substrate according to dry deposition such as a sputtering method, and a method involving coating a hardcoat layer with a resin containing fine particles to form an antireflection layer. In general, an antireflection member on which a resin layer is formed has the advantages of being small in change of a slanted reflection color phase, excellent in chemical stability (in particular, alkali resistance), and inexpensive, as compared with such a member on which an inorganic thin film is formed. On the other hand, such an antireflection member on which a resin layer is formed tends to be inferior in mechanical properties such as scratch resistance and also high in reflectance, as compared with such a member on which an inorganic thin film is formed.

For example, Patent Literature 1 and Patent Literature 2 deal with such problems and allow a low refractive index layer to contain hollow-shaped inorganic nanoparticles of silica or the like and solid-state inorganic nanoparticles. Furthermore, such solid-state inorganic nanoparticles are eccentrically located at an interface with a hardcoat, and such hollow-shaped inorganic nanoparticles are eccentrically located opposite to the interface. Thus, both high scratch resistance and a low reflectance are satisfied.

Patent Literature 3 discloses an enhancement in surface hardness (scratch resistance) by allowing reactive silica fine particles in a low refractive index layer to be eccentrically located at an interface with a hardcoat layer and/or an interface opposite to the hardcoat layer, to thereby allow hollow-shaped silica fine particles to be densely packed in the low refractive index layer.

Patent Literature 4 discloses formation of an antireflection film in which hollow silica fine particles and fine silica particles are dispersed in a binder mainly containing a reactive silane compound, on an optical substrate.

CITATION LIST

Patent Literature

PTL 1: JP 2018-533068 A
PTL 2: JP 2018-533762 A
PTL 3: JP 6011527 B
PTL 4: JP 2007-078711 A

SUMMARY OF INVENTION

Technical Problem

However, the antireflection member on which a resin layer is formed has a limitation in steel wool resistance even by addition of silica fine particles into a low refractive index layer as in Patent Literatures above, and still has the remaining problem of being poor in scratch resistance as compared with an inorganic thin film obtained by known dry deposition such as sputtering. The antireflection member on which a resin layer is formed also has the problem of causing a surface to be scratched only by an operation with a user finger when, in particular, applied to a touch panel type image display device.

A problem is also that no sufficient scratch resistance can be obtained in a case where an antireflection film is formed by using a binder including a reactive silane compound, as in Patent Literature 4.

An object of the present invention in view of the above problems is to provide an antireflection member having not only a low reflectance but also improved scratch resistance, and a polarizing plate, an image display device and an antireflective article each including the antireflection member.

Solution to Problem

The present inventors have found that, even if no scratches are visible even in rubbing of a surface of a resin layer with only a fine solid material (for example, sand) or only an oil content, the surface of the resin layer are scratched by rubbing the resin layer surface with any article to which an oil content including a solid material is attached. This corresponds to, for example, an operation of a touch panel type image display device by an operator with a finger onto which any oil content included in cosmetic products, foods, and like and any sand included in the air are attached.

The present inventors have made studies, and as a result, have found that the aforementioned scratches are generated mainly due to chipping-off of a part of the hollow silica particles included in a low refractive index layer and/or droppage of the hollow silica particles. The reason for such scratches is considered because of large asperity due to hollow silica particles formed on a surface of the low refractive index layer. That is, in a case where a low refractive index layer surface is rubbed with a finger onto which an oil content including a solid material such as sand is attached, the oil content serves as a binder and the finger is moved on the low refractive index layer surface with a solid content being attached onto the finger. It is here considered that a phenomenon where a portion of the solid material (for example, a protruded part of sand) enters into a concave portion of the low refractive index layer surface and a phenomenon where the solid material entering into the concave portion slips from the concave portion together with the finger, and traverses a convex portion (hollow silica particles) easily occur, and at that time a large force is applied to the convex portion (hollow silica particles), thereby the hollow silica particle are damaged or drop. It is also considered that a resin itself located on the concave portion is also scratched due to friction with the solid material and/or the hollow silica particles are more likely to drop due to damage.

The present inventors have then made intensive studies about measures for solving the above problems, and can obtain an antireflection member having low reflectance and excellent in surface resistance, for example, high in scratch resistance in which a surface of a low refractive index layer is smooth, leading to completion of the present invention.

The present invention provides the following [1] to [11] in order to solve the problems.

[1] An antireflection member comprising a low refractive index layer on a transparent substrate, wherein the low refractive index layer comprises a binder resin and silica particles, and a ratio of Si element attributed to the silica particles, obtained by analysis of a surface region of the low refractive index layer by X-ray photoelectron spectroscopy, is 10.0 atomic percent or more and 18.0 atomic percent or less and a ratio of C element under the assumption that the ratio of Si element is defined to be 100 atomic percent is 180 atomic percent or more and 500 atomic percent or less.

[2] The antireflection member according to [1], wherein the silica particles correspond to hollow silica particles and non-hollow silica particles.

[3] The antireflection member according to [2], wherein a ratio of an average particle size of the non-hollow silica particles to an average particle size of the hollow silica particles is 0.29 or less.

[4] The antireflection member according to [2] or [3], wherein the hollow silica particles have an average particle size of 50 nm or more and 100 nm or less and the non-hollow silica particles have an average particle size of 5 nm or more and 20 nm or less.

[5] The antireflection member according to any one of [2] to [4], wherein surfaces of the hollow silica particles and non-hollow silica particles are coated with a silane coupling agent.

[6] The antireflection member according to [1], wherein the surface region of the low refractive index layer substantially contains no fluorine atom.

[7] The antireflection member according to any one of [1] to [6], wherein the low refractive index layer has an indentation hardness of 480 MPa or more according to a nanoindentation method.

[8] The antireflection member according to any one of [1] to [7], wherein the low refractive index layer has a recovery rate of 80% or more according to a nanoindentation method.

[9] The antireflection member according to any one of [1] to [8], wherein Rz/Ra is 22.0 or less where Rz represents a maximum height roughness of the low refractive index layer surface and Ra represents an arithmetic average roughness of the low refractive index layer surface.

[10] A polarizing plate comprising a transparent protection plate, a polarizer and a transparent protection plate in the listed order, wherein at least one of the two transparent protection plates is the antireflection member according to any one of [1] to [9].

[11] An image display device comprising the antireflection member according to any one of [1] to [9], on a display element.

[12] An antireflective article comprising the antireflection member according to any one of items [1] to [9], on a member.

Advantageous Effect of Invention

According to the present invention, there can be provided an antireflection member which not only has a low reflectance, but also is excellent in surface resistance such as scratch resistance.

DESCRIPTION OF EMBODIMENTS

Hereinafter, the antireflection member of the present invention will be described in detail. A numerical value range herein designated as "AA to BB" means "AA or more and BB or less".

[Antireflection Member]

The antireflection member of the present invention is an antireflection member comprising a low refractive index layer on a transparent substrate, in which the low refractive index layer comprises a binder resin and silica particles, and the ratio of Si element attributed to the silica particles, obtained by analysis of a surface region of the low refractive index layer by X-ray photoelectron spectroscopy, is 10.0 atomic percent or more and 18.0 atomic percent or less and the ratio of C element under the assumption that the ratio of Si element is defined to be 100 atomic percent is 180 atomic percent or more and 500 atomic percent or less.

The silica particles preferably comprise hollow silica particles and non-hollow silica particles.

Figure 1:
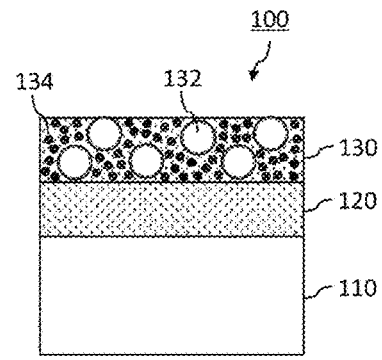
FIG. 1 is a cross-sectional schematic view schematically illustrating one embodiment of the antireflection member of the present invention.

FIG. 1 is a cross-sectional schematic view schematically illustrating one embodiment of the antireflection member of the present invention. An antireflection member 100 in FIG. 1 is configured so that a hardcoat layer 120 and a low refractive index layer 130 are laminated in the listed order on one surface of a transparent substrate 110. The low refractive index layer 130 contains hollow silica particles 132 and non-hollow silica particles 134, as silica particles.

Figure 2:
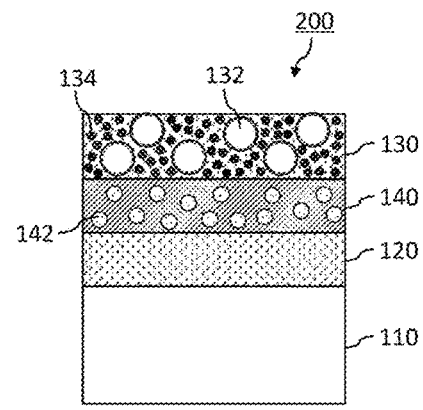
FIG. 2 is a cross-sectional schematic view schematically illustrating another embodiment of the antireflection member of the present invention.

FIG. 2 is a cross-sectional schematic view schematically illustrating another embodiment of the antireflection member of the present invention. An antireflection member 200 in FIG. 2 comprises a high refractive index layer 140 between a hardcoat layer 120 and a low refractive index layer 130. The high refractive index layer 140 contains inorganic fine particles 142 having a high refractive index.

[Properties of Antireflection Member]

<Optical Characteristics>

The antireflection member of the present invention preferably has a luminous reflectance Y value of 1.0% or less, more preferably 0.5% or less, as measured at an incident angle of light of 5 degrees through a location where the low refractive index layer is provided. The luminous reflectance Y value herein refers to the luminous reflectance Y value of the CIE 1931 standard colorimetric system. The luminous reflectance Y value can be calculated with a spectral photometer (for example, trade name "UV-3600 plus" manufactured by Shimadzu Corporation).

In general, an antireflection member (hereinafter, referred to as "dry antireflection member") obtained by forming a four-layered or five-layered film according to a sputtering method has a luminous reflectance Y value of 0.5% or less. The antireflection member of the present invention exhibits a low reflectance at a comparable level with that of the dry antireflection member.

The antireflection member of the present invention is less varied in change in luminous reflectance upon an increase in incident angle of light than the dry antireflection member. That is, the antireflection member is small in change of a slanted reflection color phase.

The antireflection member of the present invention preferably has a total light transmittance of 50% or more, more preferably 80% or more, further preferably 90% or more, determined according to JIS K7361-1: 1997. The total light transmittance and haze described below can be measured with, for example, a haze meter (item number: HM-150) manufactured by Murakami Color Research Laboratory Co., Ltd.

The antireflection member of the present invention preferably has a haze of 1.0% or less, more preferably 0.5% or less, further preferably 0.2% or less, as determined according to JIS K7136: 2000, except in a case where antiglare properties are imparted. The haze is preferably less than 5.0% when emphasis is on clearness in transmission and contrast, and is preferably 5 to 50% when emphasis is on antiglare properties.

<Element Analysis of Surface Region of Low Refractive Index Layer>

In a case where the surface of the low refractive index layer in the antireflection member of the present invention is analyzed by X-ray photoelectron spectroscopy (hereinafter, simply referred to as "XPS"), at least a C element, an O element, and a Si element are detected. The Si element is derived from the silica particles (inorganic component) and an organic component such as a silane coupling agent and/or a leveling agent. The C element is derived from a binder resin, a surface treatment agent (silane coupling agent) of the silica particles, and an additive. Herein, the C element can be considered to be substantially derived from a binder resin, in consideration of the content in the low refractive index layer.

The surface region of the low refractive index layer in the present invention, analyzed by XPS, exhibits a ratio of Si element attributed to the silica particles, of 10.0 atomic percent or more and 18.0 atomic percent or less, and a ratio of C element under the assumption that the ratio of Si element is defined to be 100 atomic percent, of 180 atomic percent or more and 500 atomic percent or less. The "surface region" in the present invention means a region which is in a region detected by X-ray photoelectron spectroscopy and which is located to a depth of 10 nm from a surface of the low refractive index layer, the surface being located opposite to the hardcoat layer.

The "ratio of C element under the assumption that the ratio of Si element is defined to be 100 atomic percent" can be calculated according to "C/Si×100(%)". Hereinafter, the "ratio of C element under the assumption that the ratio of Si element is defined to be 100 atomic percent" is sometimes abbreviated as "C/Si". Si studied in the present invention corresponds to an inorganic Si element attributed to the silica particles, and thus Si means an inorganic Si element also if there is no description.

The C/Si in the surface region of the low refractive index layer reflects a distribution state of non-hollow silica particles and hollow silica particles in the thickness direction of the low refractive index layer.

In a case where the silica particles are eccentrically located close to a surface located opposite to the low refractive index layer (close to the hardcoat layer), the ratio of Si element attributed to the silica particles in the surface region is low and the ratio of C element is relatively high. A case where the silica particles are embedded in the binder resin and are almost not present in the low refractive index layer surface also shows the same tendency. In a case where the silica particles (in particular, hollow silica particles) are not covered with the binder resin but exposed on the low refractive index layer surface, the ratio of Si element attributed to the silica particles is high and the ratio of C element is relatively low.

The ratio of Si element attributed to the silica particles in the surface region of the low refractive index layer reflects a presence state of non-hollow silica particles and hollow silica particles in the surface region.

Even when hollow silica are largely present in the surface region of the low refractive index layer, the hollow silica particles does not highly contribute to an increase in ratio of Si element attributed to the silica particles since they are hollow, while when non-hollow silica particles are largely present in the surface region, an ratio of Si element attributed to the silica particles increases. The silica particles are present in the surface region of the low refractive index layer in a sufficient amount to thereby allow the ratio of Si element attributed to the silica particles in the surface region of the low refractive index layer to satisfy 10.0 atomic percent or more. In particular, the ratio of Si element attributed to the silica particles is preferably 13.0 atomic percent or more because the non-hollow silica particles are present on the surface at a high concentration and scratch resistance is thus enhanced. In a case where the ratio of Si element attributed to the silica particles is more than 18.0 atomic percent, not only non-hollow silica but also the hollow silica particles are largely present in the surface region and are thus exposed on the surface, to thereby cause deterioration in scratch resistance.

The silica particles are present in the surface region of the low refractive index layer in a sufficient amount to thereby allow the C/Si to satisfy 500 atomic percent or less. In a case where the C/Si is more than 500 atomic percent, the silica particles are embedded in the binder resin and the binder resin is excessive in the surface region, to thereby cause no sufficient scratch resistance to be obtained. In a case where the C/Si is less than 180 atomic percent, the amount of the silica particles present in the surface is increased and in particular any hollow silica particles not covered with the binder resin are exposed on the surface, to thereby cause deterioration in scratch resistance. The C/Si is preferably 200 atomic percent or more, more preferably 250 atomic percent or more in consideration of scratch resistance and sufficient covering properties. The C/Si is preferably 400 atomic percent or less, more preferably 350 atomic percent or less.

When the ratio of C element and the ratio of Si element in the surface region of the low refractive index layer can be in the aforementioned respective ranges, the hollow silica particles are covered with an appropriate amount of the binder resin, and a sufficient amount of the non-hollow silica particles are present in spaces between the hollow silica particles. Thus, it is possible to obtain an antireflection member having a low reflectance and excellent surface resistance, such as high scratch resistance, in which the surface of the low refractive index layer surface is smooth.

In a case where a low refractive index layer is formed with a reactive silane compound as a binder raw material as in Patent Literature 4, the C/Si value is very small. In other words, a low refractive index layer with a reactive silane compound as a binder raw material and a low refractive index layer with a resin as a binder are different in C/Si. In the case of the low refractive index layer with a reactive silane compound as a binder raw material, scratch resistance or the like are deteriorated from the influence of a binder component. Accordingly, it can be said that the antireflection member having excellent surface resistance such as high scratch resistance can be obtained when the C/Si in the surface region of the low refractive index layer is 180 atomic percent or more and 500 atomic percent or less.

Even in a case where a coating composition for forming a low refractive index layer does not contain a fluorine-containing compound such as a fluorine-based leveling agent, fluorine may be detected on a surface of a low refractive index layer formed. The reason for this is because a fluorine-based leveling agent is contained in a hardcoat layer serving as an underlayer of the low refractive index layer and a lower layer such as a high refractive index layer described below and the fluorine-based leveling agent is diffused in the low refractive index layer in formation of the low refractive index layer and transferred to the low refractive index layer surface.

No F element may be preferably detected by XPS in the antireflection member of the present invention even in a case where the fluorine-based leveling agent (fluorine-containing compound) is contained in the lower layer. In other words, the surface region of the low refractive index layer may preferably contain substantially no fluorine atom. In a case where the fluorine-containing compound is present in the surface region, scratches may easily occur in the binder resin itself, and the hollow silica particles may easily drop depending on processing conditions. That is, the fluorine-containing compound is contained in the low refractive index layer to thereby cause deterioration in scratch resistance in such a case. The presumed reason is that hardness of the binder resin itself is deteriorated since the fluorine-containing compound itself is soft. The low refractive index layer exhibits the aforementioned element ratio and contains the silica particles at a high concentration relative to the binder resin, to thereby enable diffusion of the fluorine-containing compound to be suppressed, easily resulting in a state where substantially no F atom is contained in the surface region. The phrase "substantially containing no fluorine atom" herein means that the ratio of F element in the surface region is 0.5 atomic percent or less, more preferably 0.1 atomic percent or less.

The antireflection member of the present invention also exerts the effect of having high gas barrier properties (water-vapor transmission rate and oxygen gas transmission rate) since the surface region of the low refractive index layer shows the aforementioned element ratio.

<Dispersion State of Silica Particles>

The hollow silica particles and the non-hollow silica particles are preferably uniformly dispersed in the low refractive index layer of the antireflection member of the present invention in order that the aforementioned element ratio is realized. The phrase "uniformly dispersed" in the present invention means that the hollow silica particles and the non-hollow silica particles are not only uniformly dispersed in the surface region of the low refractive index layer, but also uniformly dispersed in the thickness direction of the low refractive index layer in a cross-sectional view. That is, in a case where XPS analysis is performed in the thickness direction of the low refractive index layer, the ratio of Si element attributed to the silica particles and the C/Si preferably satisfy the aforementioned respective ranges at different points in the thickness direction. For example, in a case where the thickness of the low refractive index layer is trisected and regions obtained are defined as a first region, a second region and a third region sequentially closer to the transparent substrate, arbitrary point in the first region and arbitrary point in the second region also preferably satisfy the aforementioned respective ranges with respect to the ratio of Si element attributed to the silica particles and the C/Si.

Figure 3:
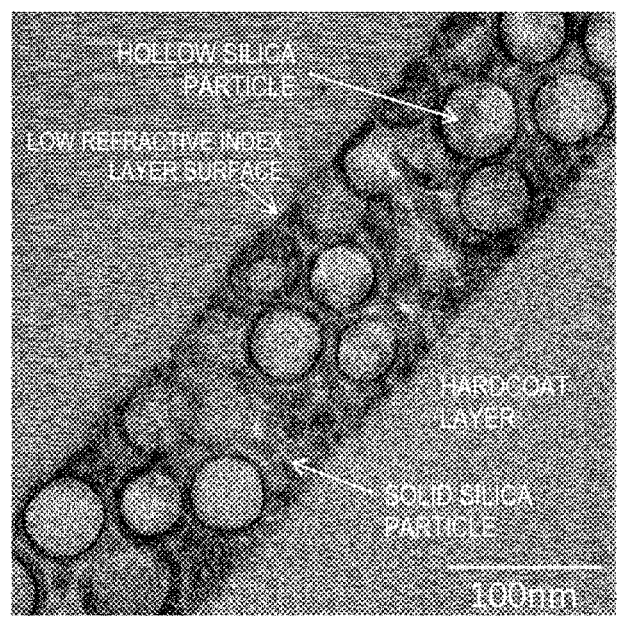
FIG. 3 is a cross-sectional image of a low refractive index layer in Example 1.

FIG. 3 is a cross-sectional image obtained by observation of a low refractive index layer of an antireflection member in Example 1 of the present invention, with a transmission electron microscope (TEM). In the low refractive index layer in the present invention, a large amount of the non-hollow silica particles (solid silica particles) are present together with the binder resin not only at the interface between the low refractive index layer and the hardcoat layer, but also on a surface of the low refractive index layer (a surface located opposite to the hardcoat layer). A plurality of the hollow silica particles are arranged in the thickness direction. It is considered from the image of FIG. 3 that the non-hollow silica particles are uniformly dispersed in the thickness direction of the low refractive index layer. It can also be confirmed that the hollow silica particles are small in amount of protrusion thereof from the low refractive index layer surface and covered with the binder resin.

Figure 4:
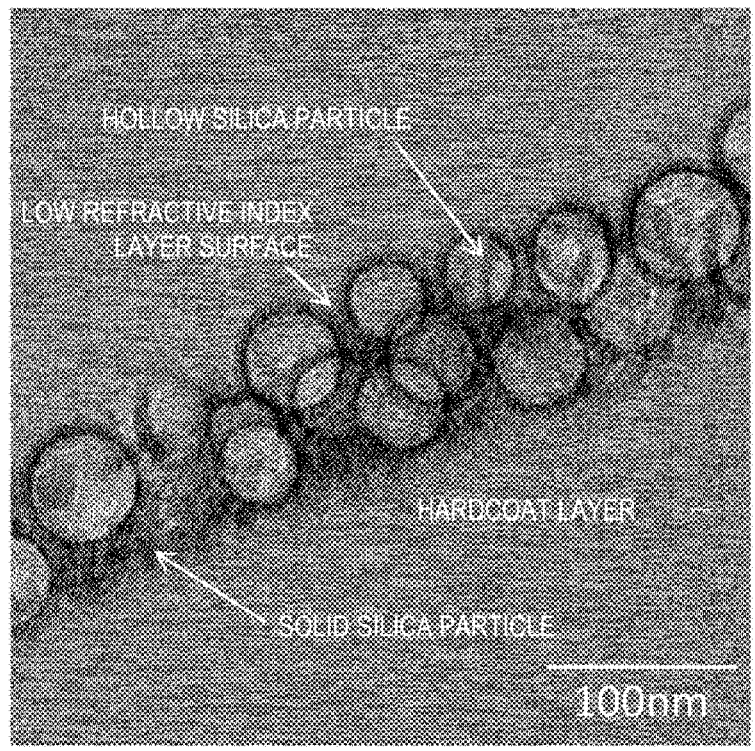
FIG. 4 is a cross-sectional image of a low refractive index layer in Comparative Example 2.
Figure 5:
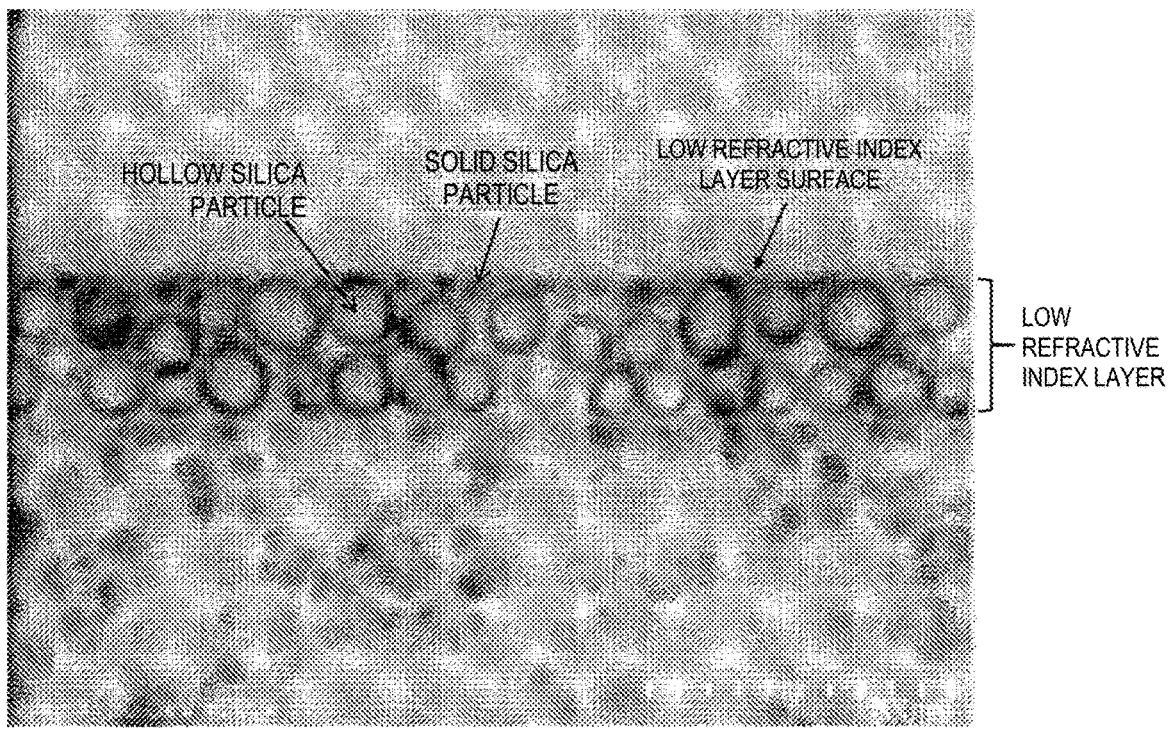
FIG. 5 is a cross-sectional image of a low refractive index layer in Comparative Example 5.

FIG. 4 and FIG. 5 each illustrate a cross-sectional image of one example of a low refractive index layer poor in dispersibility of particles.

FIG. 4 is a cross-sectional image obtained by observation of a low refractive index layer of an antireflection member of Comparative Example 2 with a transmission electron microscope. It can be confirmed in FIG. 4 that the non-hollow silica particles (solid silica particles) are eccentrically located so as to be closely spaced at the interface between the low refractive index layer and the hardcoat layer. It can also be confirmed that the hollow silica particles are highly protruded from the low refractive index layer surface and not covered with the binder resin but exposed.

FIG. 5 is a cross-sectional image obtained by observation of a low refractive index layer of an antireflection member of Comparative Example 5, with a scanning electron microscope (SEM). It can be confirmed in FIG. 5 that the non-hollow silica particles (solid silica particles) are eccentrically located so as to be closely spaced on a surface of the low refractive index layer.

The cross-sectional images of FIG. 3 to FIG. 4 are each acquired by observation with electron microscope H-7650 manufactured by Hitachi High-Technologies Corporation in conditions of an emission current of 10 µA, an acceleration voltage of 100 keV and a filament voltage of 20 V. The cross-sectional image of FIG. 5 is acquired by observation with electron microscope S-4800 manufactured by Hitachi High-Technologies Corporation in conditions of an emission current of 10 µA and an acceleration voltage of 30 keV.

<Scratch Resistance>

The low refractive index layer of the antireflection member of the present invention is excellent in both steel wool resistance and oil dust resistance, as scratch resistance.

In general, pencil hardness is known as an index representing scratch resistance of the surface of an optical member such as an antireflection member. However, the pencil hardness is to evaluate resistance upon contact of a hard article at a stress close to a point load. On the other hand, micro scratches occurring due to mild application of a surface load are largely generated in repeated friction and/or long-term use. It is reasonable that resistance to such scratches is evaluated in terms of steel wool resistance and oil dust resistance as indexes different from the pencil hardness.

The steel wool resistance in the present invention is obtained by rubbing the low refractive index layer surface with steel wool under loading in the following conditions, thereafter performing observation with change in angle between a light-emission portion and a subject, and determining a maximum load in no observation of scratches (zero scratches) of the low refractive index layer with the naked eye. Each observation is performed under a fluorescent lamp (illuminance: 200 to 2000 Lx, for example, model number: FHF32EX-N-H, a three band fluorescent lamp manufactured by Panasonic Corporation) and an LED illumination (illuminance: 100 to 8000 Lx, for example, model number: LPL-48 N manufactured by Ohm Electric Inc.), and the distance between the light-emission portion and the subject is 10 cm to 300 cm.

The area of the steel wool contacted with the subject (low refractive index layer surface) is in a range of from 0.5 to 1.5 $cm^2$. The shape of a surface on which the steel wool and the subject are contacted can be, for example, a round shape, a triangular shape, or a polygonal shape, and is preferably a round shape. The steel wool is moved at a one-way moving distance of 30 mm or more (moving distance per stroke: 60 mm or more) in the same place in a test. The one-way moving distance is appropriately set depending on the size of a device to which the antireflection member is applied.

<Test Conditions>
  Steel wool: product name: Bonstar, item number: #0000, manufactured by Nihon Steel Wool Co., Ltd.
  Moving speed: 100 mm/sec
  Number of strokes: 10

The low refractive index layer of the antireflection member of the present invention preferably has a steel wool resistance under the fluorescent lamp of 750 $g/cm^2$ or more, more preferably 900 $g/cm^2$ or more, further preferably 1000 $g/cm^2$ or more, particularly preferably 1200 $g/cm^2$ or more. The low refractive index layer preferably has a steel wool resistance under the LED of 450 $g/cm^2$ or more, more preferably 500 $g/cm^2$ or more, further preferably 600 $g/cm^2$ or more, particularly preferably 700 $g/cm^2$ or more.

An antireflection member produced by a conventional wet method has a steel wool resistance under the fluorescent lamp of 700 $g/cm^2$ or less, and a steel wool resistance under the LED of 200 $g/cm^2$ (minimum examination load) or less. A commercially available dry antireflection member (a fluorine-based coating film is laminated on a five-layered sputtering film having an outermost layer of $SiO_2$) has a steel wool resistance under the fluorescent lamp of about 1500 $g/cm^2$, and a steel wool resistance under the LED of 200 $g/cm^2$ (minimum examination load) or less. That is, the antireflection member of the present invention has a higher steel wool resistance than that of an antireflection member produced by a conventional wet method, and can realize excellent steel wool resistance comparable with that of the dry antireflection member in evaluation under the fluorescent lamp. The antireflection member of the present invention has more excellent steel wool resistance than that of the dry antireflection member under the LED.

The hollow silica particles in the low refractive index layer of the antireflection member of the present invention are small in amount thereof exposed on the surface and are covered with the binder resin. The hardness of the binder resin itself is increased since the non-hollow silica particles are present in the binder resin in the surface region at a high concentration, and it is considered that the variation in shrinkage in resin curing is suppressed to result in a smooth surface since the non-hollow silica particles are uniformly dispersed in the binder resin. Thus, it is presumed that damage or droppage of the hollow silica particles and damage of the binder resin itself can be inhibited when the surface of the low refractive index layer in the present invention is rubbed with steel wool.

An oil dust resistance test is a test for determining a scratch mark in rubbing of the surface of a subject where a cloth or waste cloth is impregnated with a mixed liquid of AC dust and olive oil, prescribed in ISO12103-1. As the AC dust, Fine (A2), Coarse (A4), or a mixed article of Fine (A2) and Coarse (A4) can be used. The oil dust resistance in the present invention is obtained by rubbing the low refractive index layer surface with the cloth or waste cloth impregnated with the mixed liquid under loading in the following conditions, and thereafter determining a maximum load in no observation of scratches (zero scratches) of the low refractive index layer with the naked eye. Each observation is performed under a fluorescent lamp (illuminance: 200 to 2000 Lx) and an LED (illuminance: 100 to 8000 Lx), and the distance between the light-emission portion and the subject is 10 cm to 300 cm.

The oil dust resistance test is performed by attaching the cloth or waste cloth to an end portion of a metal member, impregnating the resultant with the mixed liquid, and moving the cloth or waste cloth which is in contact with the subject. The shape of a contact surface between the end portion of a metal member and the subject (low refractive index layer surface) can be, for example, a triangular shape, a polygonal shape, or a round shape, and is preferably a square. The area of the contact surface is preferably in a range of from 0.5 to 1.5 $cm^2$. The cloth or waste cloth is moved at a distance of 30 mm or more by 60 mm or more per stroke in the same place in the test. The one-way moving distance is appropriately set depending on the size of a device to which the antireflection member is applied.

<Test Conditions>
  Moving speed: 100 mm/sec
  Number of strokes: 10

The low refractive index layer of the antireflection member of the present invention preferably has an oil dust resistance of 700 $g/cm^2$ or more, more preferably 750 $g/cm^2$ or more, further preferably 800 $g/cm^2$ or more, particularly preferably 1200 $g/cm^2$ or more under the fluorescent lamp. The low refractive index layer of the antireflection member of the present invention preferably has an oil dust resistance of 400 $g/cm^2$ or more, more preferably 450 $g/cm^2$ or more, further preferably 500 $g/cm^2$ or more, particularly preferably 900 $g/cm^2$ or more under the LED lamp.

An antireflection member produced by a conventional wet method has an oil dust resistance of about 200 $g/cm^2$ under the fluorescent lamp and an oil dust resistance of 100 $g/cm^2$ (minimum examination load) or less under the LED. A commercially available dry antireflection member (a fluorine-based coating film is laminated on a five-layered sputtering film having an outermost layer of $SiO_2$) has an oil dust resistance of 1500 $g/cm^2$ as evaluated under the fluorescent lamp, whereas has an oil dust resistance of 100 $g/cm^2$ (minimum examination load) or as evaluated under the LED. That is, the antireflection member of the present invention is more excellent in oil dust performance than that of an antireflection member produced by a conventional wet method in both evaluations under the fluorescent lamp and under the LED. The antireflection member of the present invention has excellent oil dust resistance comparable with that of a conventional dry antireflection member, under the fluorescent lamp, and furthermore has more excellent oil dust resistance than that of a conventional dry antireflection member under the LED.

<Surface Roughness>

The low refractive index layer in the present invention has preferably a smooth surface in order that excellent surface resistance is obtained. The maximum height roughness Rz may be 110 nm or less and is preferably 100 nm or less, further preferably 90 nm or less. It is preferably 70 nm or less, more preferably 60 nm or less, because further excellent surface resistance is obtained when the surface is smooth. The Rz/Ra (Ra is arithmetic average roughness) is preferably 22.0 or less, more preferably 18.0 or less, further preferably 16.0 or less, still further preferably 12.0 or less. Ra and Rz in the present invention are each obtained by extending the roughness of a two dimensional roughness parameter to three dimensional one as described in scanning probe microscope SPM-9600 upgrade kit instruction manual (SPM-960 February 2016, pp 194-195). Ra and Rz are defined as follows.

(Arithmetic Average Roughness Ra)

Ra is determined by the following expression where only a reference length (L) is extracted from a roughness curve in the direction of an average line, an X-axis is taken in the direction of the average line of the extracted portion and a Y-axis is taken in the longitudinal magnification direction, and the roughness curve is represented by y=f(x).

$$Ra = \frac{1}{L}\int_0^L |f(x)|dx \qquad \text{[Expression 1]}$$

(Maximum Height Roughness Rz)

Rz corresponds to a value obtained by extracting only the reference length from the roughness curve in the direction of the average line, and measuring the interval between the peak line and the valley line of the extracted portion in the longitudinal magnification direction of the roughness curve.

A low Rz means a small convex portion due to hollow silica particles in a micro region. A low Rz/Ra means a uniform asperity due to silica particles in a micro region and means no asperity protruded relative to the average difference of elevation of asperity. The numerical value of Ra in the present invention is not particularly limited, and Ra is suitably 15 nm or less, further suitably 12 nm or less. Ra is preferably 10 nm or less, more preferably 6.5 nm or less in order that more excellent surface resistance is obtained.

The low refractive index layer exhibits the aforementioned element ratio, to thereby allow the non-hollow silica particles to be present in a sufficient amount for the binder between the hollow silica particles, and enable the hollow silica particles to be present in the surface region with being not protruded on the surface but covered with the binder resin and enable the variation in shrinkage of the low refractive index layer to be suppressed. Thus, the respective ranges of Rz and Rz/Ra are easily satisfied.

Rz of the surface of the low refractive index layer may be increased to about 90 to 110 nm depending on processing conditions of the low refractive index layer. In a case where Rz/Ra is in the aforementioned range, preferable surface resistance is easily obtained.

When Rz and Rz/Ra of the low refractive index layer surface are in the aforementioned respective ranges, the resistance in traversing of the convex portion (due to any hollow silica particles present in the vicinity of the surface) of the low refractive index layer surface by a solid material can be reduced. It is thus considered that a solid material is smoothly moved on the low refractive index layer surface even in rubbing under loading with AC dust including an oil content. It is also considered that the hardness itself of the concave portion is increased. It can be presumed that the hollow silica particles are consequently prevented from being broken and/or dropping and the binder resin itself is also prevented from being damaged.

On the other hand, in a case where Rz and Rz/Ra of the low refractive index layer surface are too low, blocking may occur in the course of production. Thus, Rz is preferably 30 nm or more, more preferably 70 nm or more. Rz/Ra is preferably 3.0 or more, more preferably 5.0 or more.

<Indentation Hardness and Recovery Rate>

The low refractive index layer in the present invention preferably has an indentation hardness of 480 MPa or more, as measured by a nanoindentation method. The low refractive index layer in the present invention preferably has a recovery rate of 80% or more, as measured by a nanoindentation method. The indentation hardness and the recovery rate satisfy the aforementioned respective ranges, to thereby enable a low refractive index layer excellent in both steel wool resistance and oil dust resistance to be obtained.

The indentation hardness and the recovery rate are affected by any layer located lower than the low refractive index layer (closer to the transparent substrate). The indentation hardness and the recovery rate can be enhanced by providing the hardcoat layer on such a lower layer of the low refractive index layer and further providing a high refractive index layer between the low refractive index layer and the hardcoat layer, in the present invention.

The indentation hardness is preferably 500 MPa or more, more preferably 550 MPa or more, 600 MPa or more, further preferably 650 MPa or more in consideration of steel wool resistance and oil dust resistance. The indentation hardness is preferably 1000 MPa or less, more preferably 950 MPa or less, further preferably 900 MPa or less, particularly preferably 800 MPa or less.

The recovery rate is preferably 82% or more, more preferably 83% or more, further preferably 85% or more in consideration of steel wool resistance and oil dust resistance.

The product of the indentation hardness and the recovery rate ([Indentation hardness]×[Recovery rate]/100) serves as an index representing scratch resistance of the low refractive index layer. That is, it is indicated that, as the product of the indentation hardness and the recovery rate is larger, scratch resistance of the low refractive index layer is more excellent. The product in the present invention is preferably 380 MPa or more, more preferably 410 MPa or more, further preferably 460 MPa or more. The product is preferably 1000 MPa or less, more preferably 950 MPa or less, further preferably 900 MPa or less.

The "indentation hardness" in the present invention is a value obtained by measurement/analysis with a surface film physical property tester (Triboindenter TI950, manufactured by HYSITRON Inc.) according to a nanoindentation method. Measurement is performed by pushing a Berkovich indenter (material: diamond triangular pyramid) onto the surface of the low refractive index layer in the following conditions. In the measurement, the asperity state of the low refractive index surface is observed with a microscope and an area with no specific defect and a flat surface as much as possible is selected as a measurement point.

<Measurement Conditions of Indentation Hardness>
Indenter used: Berkovich indenter (model number: TI-0039, manufactured by HYSITRON Inc.)
Indentation condition: displacement control system
Maximum indentation depth: 30 nm
Loading time: 3 seconds (rate: 10 nm/sec)
Retention time: 5 seconds
Unloading time: 3 seconds (rate: 10 nm/sec)

The "recovery rate" in the present invention is a value determined by analysis from a load-displacement curve measured with a surface film physical property tester (Triboindenter TI950, manufactured by HYSITRON Inc.) according to a nanoindentation method.

The load-displacement curve is determined by performing measurement by pushing a Berkovich indenter (material: diamond triangular pyramid) onto the surface of the low refractive index layer in the following conditions. In the measurement, the asperity state of the low refractive index surface is observed with a microscope and a point which has no specific defect and which is flat as much as possible is selected as a measurement point.

<Measurement Conditions of Load-Displacement Curve>
Indenter used: Berkovich indenter (model number: TI-0039, manufactured by HYSITRON Inc.)
Indentation condition: load control system
Maximum load: 30 µN
Loading time: 3 seconds (rate: 10 µN/sec)
Retention time: 5 seconds
Unloading time: 3 seconds (rate: 10 µN/sec)

The total deformation workload $W_{total}$ and the elastic deformation workload $W_{elast}$ are calculated from the data of the load-displacement curve obtained. The total deformation workload $W_{total}$ is represented by the following expression.

$$W_{total} = W_{elast} + W_{plast}$$

$W_{plast}$: plastic deformation workload

The recovery rate (elastic recovery rate) is calculated from $W_{total}$ and $W_{elast}$ by the following expression.

$$\text{Recovery rate} = [\%] = (W_{elast} / W_{total}) \times 100$$

The optical properties, the element ratio, the surface roughness, the indentation hardness, and the recovery rate herein each mean an average value of measurement values at 14 points determined by excluding the minimum value and the maximum value from measurement values at 16 points, unless particularly noted.

In the present specification, for such 16 measurement points, it is preferable to set a center of measurement at each of 16 intersection points obtained by defining a region of 0.5 cm from the outer edge of a measurement specimen as a margin, and drawing lines that divide the area inside the margin into five equal parts in each of longitudinal and lateral directions, respectively. For example, in a case where the measurement specimen is a quadrangular shape, it is preferable that measurement is performed at each of 16 intersection points obtained by defining a region of 0.5 cm from the outer edge of the quadrangular shape as a margin and drawing dot lines that divide the area inside the margin into five equal parts in each of longitudinal and lateral directions, and the each parameters is calculated as the average value with respect to the points. In a case where such a measurement specimen has a shape other than a quadrangular shape, such as a round shape, an elliptic shape, a triangular shape, or a pentagonal shape, a quadrangle was drawn in the specimen with the above shape, and the measurement is preferably performed at 16 points according to the aforementioned procedure with respect to the quadrangle.

The optical properties, the surface roughness, the indentation hardness, and the recovery rate are herein each a value obtained by measurement at a temperature of 23±5° C. and a relative humidity of 40 to 65%, unless particularly noted. It is noted that an objective specimen is exposed to the atmosphere for 30 minutes or more before the start of each measurement and each evaluation and each measurement and each evaluation are performed. It is noted that element analysis is also performed after an objective specimen is exposed to the atmosphere for 30 minutes or more before the start of measurement.

Hereinafter, various conditions for obtaining the antireflection member of the present invention will be described.

[Transparent Substrate]

The transparent substrate serves as a support of the hardcoat layer and the low refractive index layer. The transparent substrate is suitably one having high light transmissivity. Specifically, one is preferable which has a total light transmittance of 90% or more according to JIS K7361-1: 1997.

Examples of the transparent substrate include plastic and glass substrates. The transparent substrate more preferably includes plastic because plastic is lightweight and is easily produced.

The plastic substrate can be formed from one or more selected from a polyolefin-based resin such as polyethylene or polypropylene, a vinyl-based resin such as polyvinyl chloride, polyvinylidene chloride, polyvinyl alcohol, an ethylene/vinyl acetate copolymer or an ethylene/vinyl alcohol copolymer, a polyester-based resin such as polyethylene terephthalate, polyethylene naphthalate or polybutylene terephthalate, an acrylic resin such as polymethyl (meth)acrylate or polyethyl (meth)acrylate, a styrene-based resin such as polystyrene, a polyamide-based resin such as nylon 6 or nylon 66, a cellulose-based resin such as triacetyl cellulose, a resin such as polycarbonate, a polyimide-based resin, and a cycloolefin resin obtained from cycloolefin such as norbornene or dicyclopentadiene.

The thickness of the plastic substrate is not particularly limited. The thickness of the plastic substrate is preferably 10 to 500 µm, more preferably 20 to 400 µm, further preferably 50 to 300 µm from the standpoint of handleability. The plastic substrate may be a plate having a thickness of more than 500 µm. In a case where flexibility is required, for example, in a foldable application, the thickness of the plastic substrate is preferably 10 to 40 µm in order that the antireflection member is in the form of a thin film. In a case where glass is used for a component to which the antireflection member is to be attached, the thickness of the plastic substrate is preferably 40 to 100 µm from the standpoint of antiscattering of such glass.

[Low Refractive Index Layer]

The low refractive index layer is a layer having a refractive index lower than that of the transparent substrate. The low refractive index layer is located opposite to a display element (for example, liquid crystal display element or EL display element), in a case where the antireflection member is incorporated into an image display device.

The low refractive index layer includes a binder resin, hollow silica particles and non-hollow silica particles.

<Binder Resin>

The binder resin includes a cured product of a curable resin composition such as a thermosetting resin composition or an ionizing radiation-curable resin composition. In particular, a cured product of a curable resin composition is suitable from the standpoint of scratch resistance. Examples of the curable resin composition include a thermosetting resin composition and an ionizing radiation-curable resin composition, and an ionizing radiation-curable resin composition is suitable from the standpoint of scratch resistance. That is, the binder resin optimally includes a cured product of an ionizing radiation-curable resin composition.

The thermosetting resin composition is a composition that includes at least a thermosetting resin, and is a resin composition to be cured by heating.

Examples of the thermosetting resin include an acrylic resin, a urethane resin, a phenol resin, a urea melamine resin, an epoxy resin, an unsaturated polyester resin, and a silicone resin. A curing agent is added to the thermosetting resin composition depending on necessity.

The ionizing radiation-curable resin composition is a composition that includes a compound (hereinafter, also referred to as "ionizing radiation-curable compound") having an ionizing radiation-curable functional group. Examples of the ionizing radiation-curable functional group include an ethylenically unsaturated bond group such as a (meth)acryloyl group, a vinyl group, and an allyl group, an epoxy group, and an oxetanyl group. The ionizing radiation-curable compound preferably has two or more ionizing radiation-curable functional groups.

The ionizing radiation-curable compound is preferably a compound having an ethylenically unsaturated bond group. In particular, a (meth)acrylate-based compound having a (meth)acryloyl group is more preferable.

Hereinafter, a (meth)acrylate-based compound having four or more ethylenically unsaturated bond groups is referred to as "multifunctional (meth)acrylate-based compound". A (meth)acrylate-based compound having 2 to 3 ethylenically unsaturated bond groups is referred to as "low functional (meth)acrylate-based compound".

As the (meth)acrylate-based compound, a monomer and an oligomer can be used. The ionizing radiation-curable compound further preferably includes a low functional (meth)acrylate-based compound, in particular, from the standpoint that the variation in shrinkage on curing is suppressed and the asperity shape of the low refractive index layer surface is easily smoothed. The proportion of the low functional (meth)acrylate-based compound in the ionizing radiation-curable compound is preferably 60% by mass or more, more preferably 80% by mass or more, further preferably 90% by mass or more, still further preferably 95% by mass or more, most preferably 100% by mass. The low functional (meth)acrylate-based compound is preferably a (meth)acrylate-based compound having two ethylenically unsaturated bond groups, from the standpoint that the variation in shrinkage on curing is suppressed and the asperity shape of the low refractive index layer surface is easily smoothed.

Also in a case where the ionizing radiation-curable compound includes a large amount of the multifunctional (meth)acrylate-based compound, the asperity shape of the low refractive index layer surface can be easily smoothed by appropriately adjusting the type and drying conditions of a solvent, as described below.

Examples of the bifunctional (meth)acrylate-based compound as the (meth)acrylate-based compound include di(meth)acrylate isocyanurate, polyalkylene glycol di(meth)acrylate such as ethylene glycol di(meth)acrylate, polyethylene glycol diacrylate, and polybutylene glycol di(meth)acrylate, bisphenol A tetraethoxy diacrylate, bisphenol A tetrapropoxy diacrylate, and 1,6-hexanediol diacrylate.

Examples of the trifunctional (meth)acrylate-based compound include trimethylolpropane tri(meth)acrylate, pentaerythritol tri(meth)acrylate, and isocyanuric acid-modified tri(meth)acrylate.

Examples of the tetrafunctional or higher functional multifunctional (meth)acrylate-based compound include pentaerythritol tetra(meth)acrylate, dipentaerythritol hexa(meth)acrylate, and dipentaerythritol tetra(meth)acrylate.

Such (meth)acrylate-based compounds may be each modified as described below.

Examples of the (meth)acrylate-based oligomer include an acrylate-based polymer such as urethane (meth)acrylate, epoxy (meth)acrylate, polyester (meth)acrylate, and polyether (meth)acrylate.

The urethane (meth)acrylate is obtained, for example, by reacting a polyhydric alcohol and an organic diisocyanate with hydroxy (meth)acrylate.

Preferred examples of the epoxy (meth)acrylate include a (meth)acrylate obtained by reacting a trifunctional or higher functional aromatic epoxy resin, alicyclic epoxy resin, aliphatic epoxy resin or the like with a (meth)acrylic acid, a (meth)acrylate obtained by reacting a bifunctional or higher functional aromatic epoxy resin, alicyclic epoxy resin, aliphatic epoxy resin or the like with a polybasic acid and a (meth)acrylic acid, and a (meth)acrylate obtained by reacting a bifunctional or higher functional aromatic epoxy resin, alicyclic epoxy resin, aliphatic epoxy resin or the like with a phenol compound and a (meth)acrylic acid.

The (meth)acrylate-based compound may have a modified partial molecular structure from the standpoint that the variation in shrinkage by crosslinking is suppressed. For example, such a compound modified with ethylene oxide, propylene oxide, caprolactone, isocyanuric acid, alkyl, cyclic alkyl, aromatic, bisphenol, or the like can also be used. In particular, the (meth)acrylate-based compound is preferably modified with an alkylene oxide such as ethylene oxide or propylene oxide from the standpoint that the affinity with the silica particles is enhanced and aggregation of particles is suppressed, and C/Si is easily in the aforementioned range. The proportion of the alkylene oxide-modified (meth)acrylate-based compound in the ionizing radiation-curable compound is preferably 60% by mass or more, more preferably 80% by mass or more, further preferably 90% by mass or more, still further preferably 95% by mass or more, most preferably 100% by mass. The alkylene oxide-modified (meth)acrylate-based compound is preferably a low functional (meth)acrylate-based compound, more preferably a (meth)acrylate-based compound having two ethylenically unsaturated bond groups.

Examples of the alkylene oxide-modified (meth)acrylate-based compound having two ethylenically unsaturated bond groups include bisphenol F alkylene oxide-modified di(meth)acrylate, bisphenol A alkylene oxide-modified di(meth)acrylate, isocyanuric acid alkylene oxide-modified di(meth)acrylate, and polyalkylene glycol di(meth)acrylate, and in particular polyalkylene glycol di(meth)acrylate is preferable. The polyalkylene glycol di(meth)acrylate preferably includes 3 to 5 alkylene glycol repeating units on average.

The alkylene glycol included in the polyalkylene glycol di(meth)acrylate is preferably ethylene glycol and/or polyethylene glycol.

Examples of the alkylene oxide-modified (meth)acrylate-based compound having three ethylenically unsaturated bond groups include trimethylolpropane alkylene oxide-modified tri(meth)acrylate and isocyanuric acid alkylene oxide-modified tri(meth)acrylate.

The ionizing radiation-curable resin can be used singly or in combinations of two or more kinds thereof.

In a case where the ionizing radiation-curable resin is an ultraviolet ray-curable resin, a coating composition for forming an antiglare layer preferably includes an additive such as a photopolymerization initiator and a photopolymerization accelerator.

Examples of the photopolymerization initiator include at least one selected from acetophenone, benzophenone, an α-hydroxyalkylphenone, Michler's ketone, benzoin, benzildimethylketal, benzoyl benzoate, an α-acyloxime ester, and a thioxanthone compound.

The photopolymerization accelerator may enhance the curing rate through the reduction of polymerization inhibition due to the air on curing, and examples thereof include at least one selected from isoamyl p-dimethylaminobenzoate and ethyl p-dimethylaminobenzoate.

The binder resin may further contain an additive such as an antistatic agent, an antioxidant, a surfactant, a dispersant, and an ultraviolet ray absorbent.

The additive in the curable resin composition constituting the binder resin is not particularly limited, and preferably includes a silicone-based leveling agent (silicone-based compound). The silicone-based leveling agent is included, to thereby enable the low refractive index layer surface to be more smoothed. Furthermore, the low refractive index layer surface can be improved in slipping properties and antifouling properties (fingerprint wiping-off properties, and large contact angles with pure water and hexadecane). A fluorine-based leveling agent, a mixture of a fluorine-based leveling agent and a silicone-based leveling agent, or a fluorine/silicone-based leveling agent, or a mixed product of a plurality of fluorine-based leveling agents and a plurality of silicone-based leveling agents can also be used depending on processing conditions.

Herein, it is also preferable not to add a fluorine-containing compound such as fluorine-containing oligomer and/or monomer having an ionizing radiation-curable functional group into the curable resin composition constituting the binder resin, in consideration of scratch resistance (steel wool resistance performance and oil dust resistance performance) of the low refractive index layer (in particular, in a case where mass production processing at a high rate is required). It is particularly preferable not to include a fluorine-based leveling agent (fluorine-containing compound) as the additive because hydrofluoric acid can be generated in the case of burning, for example, in disposal of a product. A fluorine-based leveling agent may be used in a case where compatibility between the silicone-based leveling agent and the binder resin is not favorable.

<Silica Particles>

The low refractive index layer in the present invention preferably includes hollow silica particles and non-hollow silica particles.

The hollow silica particles refer to particles which each have an outer shell layer made of silica, have a hollow thereinside, surrounded by the outer shell layer, and include air in the hollow. The hollow silica particles are particles which each include air to thereby have a lowered refractive index proportional to the occupancy of the hollow thereinside, as compared with the refractive index inherent to silica. The non-hollow silica particles are particles each having no hollow thereinside unlike the hollow silica particles. The non-hollow silica particles are, for example, solid silica particles.

Each shape of the hollow silica particles and the non-hollow silica particles is not particularly limited, and may be any of a completely spherical shape, an elliptic rotary body-like shape, and a substantially spherical shape such as a polyhedron shape that can be approximated to a spherical body. In particular, the shape is preferably a completely spherical shape, an elliptic rotary body-like shape or a substantially spherical shape in consideration of scratch resistance.

The hollow silica particles include air thereinside, and thus serve to reduce the refractive index of the entire low refractive index layer. The refractive index of the low refractive index layer can be further reduced by using the hollow silica particles with a large particle size which are increased in rate of air. On the other hand, the hollow silica particles tend to be inferior in mechanical strength. In a case where the hollow silica particles with a large particle size which are increased in rate of air are used, scratch resistance of the low refractive index layer tends to be easily deteriorated.

The non-hollow silica particles serve to enhance scratch resistance of the low refractive index layer when the non-hollow silica particles are dispersed in the binder resin.

In order that the hollow silica particles and the non-hollow silica particles are present in the binder resin at high concentrations and the particles are uniformly dispersed in the resin in the thickness direction, the average particle size of the hollow silica particles and the average particle size of the non-hollow silica particles are preferably set so that the hollow silica particles are close to each other and furthermore the non-hollow particles can be present between the hollow silica particles. Specifically, the ratio of the average particle size of the non-hollow silica particles to the average particle size of the hollow silica particles is preferably 0.29 or less, more preferably 0.20 or less. The ratio of the average particle size is preferably 0.05 or more. The average particle size of the hollow silica particles is preferably 50 nm or more and 100 nm or less, more preferably 60 nm or more and 80 nm or less in consideration of optical characteristics and mechanical strength. The average particle size of the non-hollow silica particles is preferably 5 nm or more and 20 nm or less, more preferably 10 nm or more and 15 nm or less in consideration of dispersibility with prevention of aggregation of the non-hollow silica particles.

The "average particle size" in the present invention can be calculated through the following operations (1) to (3).

(1) A cross section of the antireflection member including the particles is pictured with TEM or STEM. In TEM or STEM, preferably, the acceleration voltage is 10 kv to 30 kV and the magnification is 50000 to 300000.

(2) Arbitrary 10 particles are extracted from the observation image, and the respective particles are measured for the particle size. The particle size is determined by sandwiching the cross section of each of the particles between arbitrary two parallel straight lines, adopting a combination of two straight lines where the maximum distance between straight lines is obtained, and measuring the distance between straight lines in the combination.

(3) The same operations as above are performed five times on observation images of other screens of the same specimen, and the value obtained from the number average with respect to 50 particles in total is defined as the average particle size of the particles.

The surfaces of the hollow silica particles and the non-hollow silica particles are preferably coated with a silane coupling agent. The silane coupling agent having a (meth) acryloyl group or an epoxy group are preferably used.

Affinity between the silica particles and the binder resin can be enhanced by subjecting the silica particles to the surface treatment with a silane coupling agent, and thereby aggregation of the silica particles hardly occurs. Thus, the silica particles are easily uniformly dispersed.

Examples of the silane coupling agent include 3-methacryloxypropylmethyldimethoxysilane, 3-methacryloxypropyltrimethoxysilane, 3-methacryloxypropylmethyldiethoxysilane, 3-methacryloxypropyltriethoxysilane, 3-acryloxypropyltrimethoxysilane, 2-(3,4-epoxycyclohexyl)ethyltrimethoxysilane, 3-glycidoxypropylmethyldimethoxysilane, 3-glycidoxypropyltrimethoxysilane, 3-glycidoxypropylmethyldiethoxysilane, 3-glycidoxypropyltriethoxysilane, N-2-(aminoethyl)-3-aminopropylmethyldimethoxysilane, N-2-(aminoethyl)-3-aminopropyltrimethoxysilane, 3-aminopropyltrimethoxysilane, 3-aminopropyltriethoxysilane, 3-triethoxysilyl-N-(1,3-dimethyl-butylidene)propylamine, N-phenyl-3-aminopropyltrimethoxysilane, tris-(trimethoxysilylpropyl)isocyanurate, 3-mercaptopropylmethyldimethoxysilane, 3-mercaptopropyltrimethoxysilane, 3-isocyanatopropyltriethoxysilane, methyltrimethoxysilane, dimethyldimethoxysilane, phenyltrimethoxysilane, methyltriethoxysilane, dimethyldiethoxysilane, phenyltriethoxysilane, n-propyltrimethoxysilane, n-propyltriethoxysilane, hexyltrimethoxysilane, hexyltriethoxysilane, octyltriethoxysilane, decyltrimethoxysilane, 1,6-bis(trimethoxysilyl)hexane, trifluoropropyltrimethoxysilane, vinyltrimethoxysilane, and vinyltriethoxysilane. In particular, at least one selected from 3-methacryloxypropylmethyldimethoxysilane, 3-methacryloxypropyltrimethoxysilane, 3-methacryloxypropylmethyldiethoxysilane, and 3-methacryloxypropyltriethoxysilane is preferably used.

As the content of the hollow silica particles is increased, the rate of packing of the hollow silica particles relative to the binder resin is increased and the refractive index of the low refractive index layer is reduced. On the other hand, in a case where the content of the hollow silica particles relative to the binder resin is too high, not only the hollow silica particles exposed from the binder resin are increased, but also the binder resin for binding between the particles is decreased. Thus, the hollow silica particles tend to be damaged or drop easily, to thereby cause the low refractive index layer to be deteriorated in mechanical strength such as scratch resistance. Thus, the content of the hollow silica particles is preferably 100 parts by mass or more, more preferably 150 parts by mass or more based on 100 parts by mass of the binder resin. The content of the hollow silica particles is preferably 400 parts by mass or less, more preferably 300 parts by mass or less based on 100 parts by mass of the binder resin.

In a case where the content of the non-hollow silica particles is low, there may be no influence on an increase in hardness even in the presence of the non-hollow silica particles in the surface of the low refractive index layer. In a case where the non-hollow silica particles are contained in a large amount, the influence of the variation in shrinkage due to polymerization of the binder resin can be decreased and the asperity occurring on the low refractive index layer surface after curing of the resin can be decreased. On the other hand, in a case where the content of the non-hollow silica particles is too high, the non-hollow silica is aggregated to thereby cause the variation in shrinkage of the binder resin to occur, resulting in an increase in surface asperity. The content of the non-hollow silica particles is preferably 90 parts by mass or more, more preferably 100 parts by mass or more based on 100 parts by mass of the binder resin. The content of the non-hollow silica particles is preferably 200 parts by mass or less, more preferably 150 parts by mass or less based on 100 parts by mass of the binder resin.

When the hollow silica particles and the non-hollow silica particles are contained at the aforementioned respective proportions in the binder resin, fluorine-containing compound is not detected on the surface of the low refractive index layer even when the hardcoat layer and the high refractive index layer contain a fluorine-containing compound such as a fluorine-based leveling agent. It is presumed that the silica particles are uniformly dispersed at a high concentration in the binder resin and thus the silica particles inhibit diffusion of the fluorine-based leveling agent.

Gas barrier properties of the antireflection member itself can be enhanced by adding the hollow silica particles and the non-hollow silica particles at the aforementioned respective proportions in the binder resin. It is presumed that the silica particles are uniformly dispersed at a high rate of packing to thereby allow permeation of gas or the like to be inhibited.

A cosmetic product such as a sunscreen and a hand cream may contain a low molecular weight polymer low in volatility. The low molecular weight polymer can be inhibited from penetrating into the low refractive index layer by an improvement in barrier properties of the low refractive index layer. Thus, any failure (for example, appearance abnormality) due to the long-term remaining of the low molecular weight polymer in the low refractive index layer can be suppressed.

The thickness of the low refractive index layer is not particularly limited as long as it is 50 nm or more (equal to or more than the average particle size of the hollow silica), and is preferably 80 to 120 nm, more preferably 85 to 110 nm, further preferably 90 to 105 nm.

The refractive index of the low refractive index layer is preferably 1.40 or less, more preferably 1.35 or less. When the refractive index of the low refractive index layer is 1.40 or less, it is possible to suppress increase in reflectance of the surface of the low refractive index layer surface, easily resulting in an improvement in visibility. The lower limit of the refractive index of the low refractive index layer is about 1.10.

The refractive index herein means a refractive index at a wavelength of 589.3 nm.

[Hardcoat Layer]

In a case where the transparent substrate includes plastic, a hardcoat layer is preferably provided between the low refractive index layer and the transparent substrate. The aforementioned indentation hardness and recovery rate can be enhanced by the hardcoat layer.

The hardcoat layer includes a cured product of a curable resin composition such as a thermosetting resin composition or an ionizing radiation-curable resin composition. The curable resin here used can be the same as the curable resin for the low refractive index layer.

In a case where the ionizing radiation-curable compound is an ultraviolet ray-curable compound, an ionizing radiation-curable composition preferably includes an additive such as a photopolymerization initiator and a photopolymerization accelerator. The photopolymerization initiator and the photopolymerization accelerator here used can be the same as those for the low refractive index layer.

The hardcoat layer preferably further includes a leveling agent, as such an additive. By adding the leveling agent a coating film that serves as the hardcoat layer can be uniformly formed. As the leveling agent, a fluorine-based leveling agent, a silicone-based leveling agent, a fluorine/silicone-based leveling agent, and a mixed system thereof can be used. In the present invention, even in a case where a fluorine-based leveling agent is contained in the hardcoat layer, the silica particles in the low refractive index layer inhibits diffusion of the fluorine-based leveling agent, and thereby transfer of the fluorine-based leveling agent to the low refractive index layer surface to be can be easily suppressed.

The hardcoat layer may further contain an additive such as an antistatic agent, an antioxidant, a surfactant, a dispersant, and an ultraviolet ray absorbent.

The thickness of the hardcoat layer is preferably 0.1 to 100 μm, more preferably 0.5 to 20 μm, further preferably 1 to 10 μm. When the thickness of the hardcoat layer is within the aforementioned range, scratch resistance can be improved, and in addition the occurrence of cracks in processing such as cutting can be easily suppressed.

The refractive index of the hardcoat layer is preferably adjusted in a range of 1.45 or more and 1.70 or less.

In a case where the antireflection member comprises a high refractive index layer described below, the refractive index of the hardcoat layer is preferably lower than the refractive index of the high refractive index layer, and is more preferably 1.50 to 1.65, further preferably 1.55 to 1.60. When the refractive index of the hardcoat layer is within such a range, the reflectance can be further lowered since the hardcoat layer serves as a medium refractive index layer, and an interference among three layers of the hardcoat layer (medium refractive index layer), the high refractive index layer and the low refractive index layer can generate.

In a case where any other layer (light transmissive substrate or other layer constituting a resin layer) is present between the hardcoat layer and an adherend, the difference between the refractive index of such other layer and the refractive index of the hardcoat layer is preferably small from the standpoint of suppression of interference fringes.

The refractive index can be herein calculated, for example, by fitting of the reflectance spectrum measured with a reflection photometer and the reflectance spectrum calculated from an optical model of a multilayer thin film, using the Fresnel coefficient.

Examples of a method for providing a role as the medium refractive index layer to the hardcoat layer include a method for compounding a resin high in refractive index with a coating composition for a hardcoat layer, and a method for compounding particles high in refractive index.

Examples of the resin high in refractive index include a resin obtained by introducing, for example, a group containing sulfur, phosphorus or bromine, or an aromatic ring into the aforementioned thermosetting resin or ionizing radiation-curable compound. Examples of the particles high in refractive index include the same as high refractive index particles for use in a high refractive index layer described below.

[High Refractive Index Layer]

The high refractive index layer is a layer having a higher refractive index layer than the hardcoat layer. The layer contains high refractive index particles and a binder resin.

The high refractive index layer includes a cured product of a curable resin composition such as a thermosetting resin composition or an ionizing radiation-curable resin composition, as the binder resin. The curable resin composition here used can be the same as that exemplified with respect to the low refractive index layer, and is suitably an ionizing radiation-curable resin composition.

In a case where the ionizing radiation-curable compound is an ultraviolet ray-curable compound, an ionizing radiation-curable composition preferably includes an additive such as a photopolymerization initiator and a photopolymerization accelerator. The photopolymerization initiator and the photopolymerization accelerator here used can be the same as those for the low refractive index layer.

The high refractive index layer preferably further includes a leveling agent as an additive. A coating film serving as the high refractive index layer can be uniformly formed by adding the leveling agent. As the leveling agent, a fluorine-based leveling agent, a silicone-based leveling agent, a fluorine/silicone-based leveling agent, and a mixed system thereof can be used. In the present invention, even in a case where a fluorine-based leveling agent is contained in the high refractive index layer, the silica particles in the low refractive index layer inhibits diffusion of the fluorine-based leveling agent, and thereby transfer of the fluorine-based leveling agent to the low refractive index layer surface can be easily suppressed.

The high refractive index layer may further contain an additive such as an antistatic agent, an antioxidant, a surfactant, a dispersant, and an ultraviolet ray absorbent.

Examples of the high refractive index particles include antimony pentoxide, zinc oxide, titanium oxide, cerium oxide, tin-doped indium oxide, antimony-doped tin oxide, yttrium oxide, and zirconium oxide.

The average particle size of the high refractive index particles is preferably 5 nm or more and 200 nm or less, more preferably 5 nm or more and 100 nm or less, further preferably 10 nm or more and 80 nm or less.

The content of the high refractive index particles is preferably 100 parts by mass or more and 2500 parts by mass or less, more preferably 300 parts by mass or more and 2200 parts by mass or less, further preferably 500 parts by mass or more and 2000 parts by mass or less based on 100 parts by mass of the binder resin from the standpoint of balance between an increase in refractive index of a coating film and strength of a coating film.

In particular, indentation hardness and recovery rate can be enhanced by a high refractive index layer where high-hardness particles such as zirconium oxide, antimony pentoxide, and titanium oxide are dispersed as the high refractive index particles at a high concentration in the binder resin. The content of the high refractive index particles is preferably 1000 parts by mass or more and 2000 parts by mass or less, more preferably 1500 parts by mass or more and 2000 parts by mass or less in consideration of enhancements in indentation hardness and recovery rate of the low refractive index layer.

The refractive index of the high refractive index layer is preferably 1.55 or more and 1.85 or less, more preferably 1.56 or more and 1.75 or less.

The thickness of the high refractive index layer is preferably 200 nm or less, more preferably 50 nm or more and 180 nm or less.

[Method for Producing Antireflection Member]

The hardcoat layer, the low refractive index layer and the high refractive index layer of the antireflection member of the present invention can be formed by a wet method involving coating a transparent substrate with a coating composition including a component constituting each of the layers, and drying and curing the resultant, a transfer method for transferring each of the layers formed on the substrate according to the wet method, and the like. Each coating composition includes a solvent, a solid content constituting each of the layers, and an additive such as a polymerization initiator.

In the case of formation according to the wet method, first, a transparent substrate is coated with a coating composition for forming a low refractive index layer, and the resultant is dried and cured to form a low refractive index layer. In a case where a hardcoat layer is provided, a coating composition for forming a hardcoat layer is coated on the transparent substrate, and the resultant is dried and cured to form a hardcoat layer, and thereafter a low refractive index layer is formed in the same manner as described above. In a case where a hardcoat layer and a high refractive index layer are provided, a coating composition for forming a high refractive index layer is coated on a hardcoat layer, the resultant is dried and cured to form a hardcoat layer and a high refractive index layer, and thereafter a low refractive index layer is formed in the same manner as described above. The hardcoat layer and the high refractive index layer may be formed in the process in which the hardcoat layer and the high refractive index layer is semi-cured (not being completely cured), are completely cured when forming the low refractive index layer.

A solvent is usually used in the coating composition for forming a low refractive index layer in order to modulate the viscosity and to enable each component to be dissolved or dispersed.

Examples of the solvent include a ketone compound (acetone, methyl ethyl ketone, methyl isobutyl ketone, cyclohexanone, and the like), an ether compound (dioxane, tetrahydrofuran, and the like), an aliphatic hydrocarbon compound (hexane and the like), an alicyclic hydrocarbon compound (cyclohexane and the like), an aromatic hydrocarbon compound (toluene, xylene, and the like), a carbon halide compound (dichloromethane, dichloroethane, and the like), an ester compound (methyl acetate, ethyl acetate, butyl acetate, and the like), an alcohol compound (butanol, cyclohexanol, and the like), a cellosolve compound (methyl cellosolve, ethyl cellosolve, and the like), a cellosolve acetate compound, a sulfoxide compound (dimethylsulfoxide and the like), a glycol ether compound (1-methoxy-2-propyl acetate and the like), and an amide compound (dimethylformamide, dimethylacetamide, and the like), and the solvent may be any mixture thereof.

In a case where the solvent is too rapidly volatilized, the solvent is violently convected in drying of the coating composition for forming a low refractive index layer. Thus, even in a case where the silica particles in the coating composition are uniformly dispersed, the violent convection of the solvent during drying can easily destroy the uniform dispersion. Therefore, a solvent low in evaporation rate is preferably contained. Specifically, a solvent having a relative evaporation rate (relative evaporation rate under the assumption that the evaporation rate of n-butyl acetate is defined to be 100) of 70 or less is preferably contained, and a solvent having a relative evaporation rate of 30 to 60 is more preferably contained. Such a solvent having a relative evaporation rate of 70 or less is preferably contained at 10 to 50% by mass, preferably 20 to 40% by mass relative to the entire solvent.

The relative evaporation rate of the solvent low in evaporation rate is, for example, 64 with respect to isobutyl alcohol, 47 with respect to 1-butanol, 44 with respect to 1-methoxy-2-propyl acetate, 38 with respect to ethyl cellosolve, and 32 with respect to cyclohexanone.

A remaining solvent (solvent other than the solvent low in evaporation rate) is preferably one excellent in resin solubility. The remaining solvent is preferably one having a relative evaporation rate of 100 or more.

The drying temperature in formation of the low refractive index is preferably low as much as possible in order to inhibit convection of solvent during drying and to improve dispersibility of the silica particles. The drying temperature can be appropriately set in consideration of the type of the solvent, dispersibility of the silica particles, the production rate, and the like.

For a method for curing each of the layers, a method involving irradiation with an ionizing radiation such as an ultraviolet ray or an electron beam, or a method involving curing by heating can be adopted. Curing by an ionizing radiation is preferably adopted in consideration of productivity or the like.

[Size, Shape, etc. of Antireflection Member]

The antireflection member may be in the form of a single sheet cut to a predetermined size, or may be in the form of a roll obtained by winding a long sheet to a roll. The size of the single sheet is not particularly limited, and the maximum size is about 2 to 500 inches. The "maximum size" refers to the maximum length in connecting of arbitrary two points of the antireflection member. For example, in a case where the antireflection member has a rectangular shape, the diagonal line of the region of such a shape corresponds to the maximum size. In a case where the antireflection member has a round shape, the diameter corresponds to the maximum size.

The width and the length of the roll are not particularly limited, and in general, the width is 500 to 3000 mm and the length is about 100 to 5000 m. The antireflection member in the form of the roll can be cut to a single sheet shape tailored to the size of an image display device or the like. An end portion of the roll, where properties are not stable, is preferably excluded in the cutting.

The shape of the single sheet is also not particularly limited, and may be, for example, a polygonal shape (triangular shape, quadrangular shape, pentagonal shape, or the like) or a round shape, or may be a randomly irregular shape. More specifically, in a case where the antireflection member has a quadrangular shape, the aspect ratio is not particularly limited as long as it is not problematic in terms of a display screen. For example, width:length=1:1, 4:3, 16:10, 16:9, or 2:1.

[Polarizing Plate]

The polarizing plate of the present invention is a polarizing plate comprising a transparent protection plate, a polarizer and a transparent protection plate in the listed order, in which at least one of the two transparent protection plates is the aforementioned antireflection member.

In a case where only one of the two transparent protection plates is the aforementioned antireflection member, examples of other of such transparent protection plates include the same with respect to the aforementioned transparent substrate.

Examples of the polarizer include a sheet-type polarizer such as a polyvinyl alcohol film, a polyvinyl formal film, a polyvinyl acetal film, and an ethylene-vinyl acetate copolymer-based saponified film which are dyed with iodine or the like and are stretched, a wire grid-type polarizer formed from a large number of metal wires arranged in parallel, a coating-type polarizer coated with a lyotropic liquid crystal or a dichroic guest-host material, and a multilayer thin film-type polarizer. Such a polarizer may be a reflection-type polarizer having a function of reflecting a non-transmission polarizing component.

[Image Display Device]

The image display device of the present invention comprises the aforementioned antireflection member on a display element. In this case, the antireflection member is disposed so that the transparent substrate is located closer to the display element and the low refractive index layer is located closer to a user of the image display device. The display element and the antireflection member are preferably laminated through an adhesive layer.

Examples of the display element include a liquid crystal display element, an EL display element, a plasma display element, and an electronic paper element.

The image display device of the present invention comprises the antireflection member, and thus is extremely low in reflectance, excellent in visibility, and also is excellent in not only steel wool resistance, but also oil dust resistance.

[Antireflective Article]

The antireflective article of the present invention comprises the aforementioned antireflection member on a member. In this case, the antireflection member is disposed so that the transparent substrate is located closer to the member and the low refractive index layer is located closer to a user of the article. The member and the antireflection member are preferably laminated through an adhesive layer.

Examples of the member include an instrument panel, a watch, a showcase, a shop window, and a window. That is, examples of the article of the present invention include an instrument panel, a watch, a showcase, a shop window, and a window, in which a release layer of a low reflection member is arranged to face a surface. The member may be transparent or non-transparent, and the color tone is also not particularly limited.

EXAMPLES

Hereinafter, the present invention will be specifically described with reference to Examples and Comparative Examples. The present invention is not limited to modes described in Examples.

1. Evaluation, Measurement

The antireflection members obtained Examples and Comparative Examples were measured and evaluated in the following manners. The results are shown in Table 1 and Table 2. Unless particularly denoted and unless each test performed in a specific environment, the atmosphere in each measurement and each evaluation was at a temperature of 23±5° C. and a relative humidity of 40 to 65%, and an objective specimen was exposed to the atmosphere for 30 minutes or more before the start of each measurement and each evaluation, and then subjected to each measurement and each evaluation.

1-1. Reflectance (Luminous Reflectance Y Value)

A black plate (trade name: Comoglas DFA2CG 502K (black) type manufactured by Kraray Co., Ltd., thickness 2 mm) was adhere to a transparent substrate of each of the antireflection members of Examples and Comparative Examples through a transparent adhesive layer having a thickness of 25 μm (trade name: Panaclean PD-S1 manufactured by Panac Co., Ltd.), to thereby prepare a specimen (5 cm×5 cm).

Light was incident on the sample from a direction of 5 degrees when the direction perpendicular to the surface of the low refractive index layer of the antireflection member was set at 0 degrees, and the reflectance (luminous reflectance Y value) of the specimen was measured based on regular reflection of incident light.

The reflectance was determined as a value representing a luminous reflectance obtained by performing measurement by use of a spectral reflectometer (trade name: UV-2450 manufactured by Shimadzu Corporation) in conditions of a viewing angle of 2 degrees, a C light source, and a wavelength range of from 380 to 780 nm, and thereafter performing calculation by software (UVPC color measurement Version 3.12 built in apparatus) for conversion into brightness sensed by human eyes. The average value of the reflectances at 14 points with respect to each specimen was defined as the reflectance of each specimen.

1-2. XPS Analysis

Each measurement piece was cut out from each of the antireflection members of Examples and Comparative Examples. X-ray photoelectron spectrums of a C1s orbital, an O1s orbital, an Si2p orbital, and an F1s orbital of the low refractive index layer surface of each measurement piece were measured in the following conditions by use of an X-ray photoelectron spectrometer. Peak separation was performed with respect to each X-ray photoelectron spectrum, and the ratios of C element, O element, F element and Si element were determined. X-ray photoelectron spectra of Si2p orbitals were separated into a peak of inorganic components (silica) and a peak of organic components (silicone) to determine the ratio of Si elements ("inorganic Si" in the Table) attributed to silica particles (hollow silica particles and non-hollow silica particles). Measurement was performed at 14 points for each of measurement pieces, and further analysis was conducted with a number of measurement pieces of n=2. The resulting average was defined as the element ratio in each of Examples and Comparative Examples. The ratio of C element under the assumption that the ratio of Si element attributed to the silica particles was defined to be 100 atomic percent (C/Si) was calculated from the resulting element ratio. In Table 1 and Table 2, any element, such as an O element, other than a Si element (inorganic Si element) derived from an inorganic component, a C element, and an F element was defined as "other element" and the total element ratio was represented.

<Measurement>

Apparatus: AXIS-NOVA manufactured by Kratos Analytical

X-ray source: AlKα

Output of X-ray: 150 W

Emission current: 10 mA

Acceleration voltage: 15 kV

Measurement region: 300×700 μm 1-3. Surface Roughness

The surface profile of the low refractive index layer of each specimen of Examples and Comparative Examples produced in measurement 1-1 was measured by use of an atomic force microscope (AFM) SPM-9600 manufactured by Shimadzu Corporation in an On-Line (measurement) mode in software: SPM manager. The measurement conditions are shown below. Thereafter, a gradient correction treatment was performed with an Off-Line (analysis) mode, and a gradation image was obtained where a height of 0 nm corresponded to black and a height of 100 nm or more corresponded to white. The lowest point in the measurement area was defined as "a height of 0 nm". The resulting AFM image was analyzed, and Rz (maximum height roughness) and Ra (arithmetic average roughness) of each specimen were obtained. The respective average values of Rz and Rz/Ra at 14 points with respect to each specimen were evaluated.

<AFM Measurement Conditions>
  Measurement mode: phase
  Scanning range: 5 μm×5 μm
  Scanning rate: 0.8 to 1 Hz
  Number of pixels: 512×512
  Cantilever used: NCHR manufactured by NanoWorld AG (resonant frequency:
  320 kHz, spring constant 42 N/m)
  <AFM Analysis Conditions>
  Gradient correction: line fitting 1-4. Steel Wool Resistance Test Each of the antireflection members evaluated in 1-1 was adhere to a base of a JSPS-type abrasion tester (trade name "AB-301" manufactured by Tester Sangyo Co., Ltd.) with the low refractive index layer serving as an upper surface. Steel wool #0000 (trade name "Bonstar B-204" manufactured by Nihon Steel Wool Co., Ltd.) was prepared and contacted with the low refractive index layer surface. The steel wool was stroked ten times with loading at a moving speed of 100 mm/sec and a moving distance per stroke of 200 mm (one-way moving distance 100 mm). The contact area of the steel wool with the low refractive index layer was 1 cm$^2$. A test environment was here at a temperature of 23±1° C. and a relative humidity of 50±5%, unless particularly denoted. The Bonstar B-204 had a commercial size of a width of about 390 mm, a length of about 75 mm, and a thickness of about 110 mm. A proper amount was torn (did not cut with a blade since the cross section of a steel wool fiver was not protruded when cut), and uniformly rounded so that no specific protruded portion of the steel wool was present. The steel wool was set so that the thickness of the steel wool was 20 mm at a contact area of 1 cm$^2$ when the load was applied at 1000 g.

Thereafter, each of the antireflection members was observed with the naked eye under a fluorescent lamp (model number: FHF32EX-N-H, a three band fluorescent lamp manufactured by Panasonic Corporation, the illuminance on each specimen was 800 to 1200 Lx, observation distance 30 cm) and under an LED illumination (LED light manufactured by Gentos Co., Ltd., model number: TX-850Re, the illuminance on each specimen was 4000 to 6000 Lx, observation distance 30 cm), and the number of scratches was evaluated. The steel wool resistance was represented as the maximum load (g/cm$^2$) per unit area in no observation of scratches (zero scratches) after the test. Each test was performed at n=2 with respect to Examples and Comparative Examples, and the average was defined as the steel wool resistance of each of Examples and Comparative Examples.

1-5. Oil Dust Resistance Test

A test liquid was prepared by mixing AC dust (ISO12103-1, A2 (Fine)) and olive oil (CAS No. 8001-25-0) at 1/1 (weight ratio).

A waste cloth (trade name "Aspure Proprea II" manufactured by AS ONE Corporation) was folded into eight-ply, and firmly attached to a tip of a rod-shaped metal member (the shape of a rod-shaped end surface was a 1 cm square) by a rubber band. A surface of the rod-shaped metal member to which the waste cloth was attached was immersed in the test liquid, an end surface of the waste cloth was evenly impregnated with 5 g of the test liquid, and thus a rod-shaped metal member for rubbing was obtained.

Each of the antireflection members of Examples and Comparative Examples was adhere to a test stand so that the low refractive index layer served as an upper surface. A weight was attached to the rod-shaped metal member for rubbing, a side of the rod-shaped metal member to which the waste cloth was attached was contacted with the low refractive index layer surface, and the weight was stroked ten times at a moving speed of 100 mm/sec and a moving distance per stroke of 200 mm (one-way moving distance 100 mm). The contact area of the waste cloth with the low refractive index layer was about 1 cm$^2$ approximately equal to the area of an end surface of the rod-shaped metal member. A test environment was here at a temperature of temperature 23±1° C. and a relative humidity of 50±5%, unless particularly denoted.

Thereafter, each of the antireflection members of Examples and Comparative Examples was observed with the naked eye under a fluorescent lamp (model number: FHF32EX-N-H, a three band fluorescent lamp manufactured by Panasonic Corporation, the illuminance on the specimen was 800 to 1200 Lx, observation distance 30 cm) and under an LED illumination (LED light manufactured by Gentos Co., Ltd., model number: TX-850Re, the illuminance on each specimen was 4000 to 6000 Lx, observation distance 30 cm), and the number of scratches was evaluated. The load was represented as the weight and the oil dust resistance was represented as the maximum load (g/cm$^2$) per unit area in no observation of scratches (zero scratches) after the test observation. Each test was performed at n=2 with respect to Examples and Comparative Examples, and the average was defined as the oil dust resistance in each of Examples and Comparative Examples.

1-6. Antifouling Properties (Fingerprint Wiping-Off Properties)

The low refractive index layer surface of each of the antireflection members of Examples and Comparative Examples was pressed by a ball of a finger, and a fingerprint was marked onto the surface. Thereafter, the marked fingerprint was wiped off by a non-woven cloth (trade name: Bemcot manufactured by Asahi Kasei Corporation), and the number of wiping-off operations until no trace of the fingerprint was observed was evaluated. A case where no trace of the fingerprint was observed by three or less of wiping-off operations was designated as "A", a case where no trace of the fingerprint was observed by 4 to 7 of wiping-off operations was designated as "B", and a case where the fingerprint was observed even after wiping-off was performed seven times was designated as "C".

1-7. Indentation Hardness

A load-displacement curve with respect to the low refractive index layer of each of the antireflection members of Examples 1, 6 and 8, and Comparative Examples 1, 3 to 4 was measured in the following conditions by use of TriboIndenter TI950 manufactured by HYSITRON Inc. The indentation hardness was obtained from the resulting load-displacement curve by use of analysis software (TRIBOSCAN) attached to the apparatus. Measurement was performed at 16 points with respect to each specimen, and further analysis was conducted with a number of measurement pieces of n=2. The average of the resulting numerical values was defined as the indentation hardness in each of Examples and Comparative Examples.

<Measurement Conditions of Indentation Hardness>
  Indenter used: Berkovich indenter (TI-0039)
  Indentation condition: displacement control system
  Maximum indentation depth: 30 nm
  Loading time: 3 seconds (rate: 10 nm/sec)
  Retention time: 5 seconds
  Unloading time: 3 seconds (rate: 10 nm/sec)
  Indentation rate: 10 nm/sec 1-8. Recovery Rate A load-displacement curve with respect to the low refractive index layer of each of the antireflection members of Examples 1, 6 and 8, and Comparative Examples 1, 3 to 7 was measured in the following conditions by use of TriboIndenter TI950 manufactured by HYSITRON Inc. The recovery rate was calculated from the resulting load-displacement curve. Measurement was performed at 16 points with respect to each specimen, and further analysis was conducted with a number of measurement pieces of n=2. The average of the resulting numerical values was defined as the recovery rate in each of Examples and Comparative Examples.

<Measurement Conditions of Recovery Rate>
    Indenter used: Berkovich indenter (TI-0039)
    Indentation condition: load control system
    Maximum load: 30 μN
    Loading time: 3 seconds (rate: 10 μN/sec)
    Retention time: 5 seconds
    Unloading time: 3 seconds (rate: 10 μN/sec)

2. Preparation of Coating Composition

A coating composition for forming a hardcoat layer having the following formulation was produced.

<Coating Composition 1 for Forming Hardcoat Layer>

| | |
|---|---|
| Composition containing ultraviolet ray-curing acrylate (trade name "KAYARAD PET-30" manufactured by Nippon Kayaku Co., Ltd., solid content 100%) | 22 parts by mass |
| Composition containing ultraviolet ray-curing acrylate (trade name "New Frontier R-1403MB" manufactured by DKS Co., Ltd., solid content 80%) | 17 parts by mass |
| Fluorine-based leveling agent (trade name "Megaface F-568" manufactured by DIC Corporation) | 1 part by mass |
| Photopolymerization initiator (trade name "Omnirad 184" manufactured by IGM Resins B.V.) | 1 part by mass |
| Methyl isobutyl ketone | 15 parts by mass |
| Methyl ethyl ketone | 44 parts by mass |

<Coating Composition 2 for Forming Hardcoat Layer>

| | |
|---|---|
| Reactive silica fine particles ("Z7837" manufactured by JSR Corporation, solid content 50%, product containing 60% of reactive silica fine particles) | 10 parts by mass |
| Urethane acrylate ("UV1700B" manufactured by Mitsubishi Chemical Corporation) | 5.7 parts by mass |
| Photopolymerization initiator (trade name "Omnirad 184" manufactured by IGM Resins B.V.) | 1 part by mass |
| Fluorine-based leveling agent (trade name "Megaface F-568" manufactured by DIC Corporation) | 1 part by mass |
| Methyl ethyl ketone | 3.3 parts by mass |
| Methyl isobutyl ketone | 2.3 parts by mass |

A coating composition for forming a high refractive index layer, having the following formulation, was produced.

<Coating Composition 1 for Forming High Refractive Index Layer>

| | |
|---|---|
| PETA (trade name "KAYARAD PET-30" manufactured by Nippon Kayaku Co., Ltd., solid content 100%) | 0.15 parts by mass |
| High refractive index particles (trade name "Zircostar" manufactured by Nippon Shokubai Co., Ltd., solid content 70%) | 4.5 parts by mass |
| Fluorine-based leveling agent (trade name "Megaface F251" manufactured by DIC Corporation) | 0.01 parts by mass |
| Photopolymerization initiator (trade name "Omnirad 127" manufactured by IGM Resins B.V.) | 0.14 parts by mass |
| Methyl isobutyl ketone | 47.6 parts by mass |
| Propylene glycol monomethyl ether | 47.6 parts by mass |

<Coating Composition 2 for Forming High Refractive Index Layer>

| | |
|---|---|
| PETA (trade name "KAYARAD PET-30" manufactured by Nippon Kayaku Co., Ltd., solid content 100%) | 0.68 parts by mass |
| High refractive index particles (trade name "ELCOM V-4564" (containing antimony pentoxide particles) manufactured by, JGC C&C, solid content 40.5%) | 6.71 parts by mass |
| Fluorine-based leveling agent (trade name "Megaface F251" manufactured by DIC Corporation) | 2.03 parts by mass |
| Photopolymerization initiator (trade name "Omnirad 127" manufactured by IGM Resins B.V.) | 0.05 parts by mass |
| Methyl isobutyl ketone | 46.3 parts by mass |
| Propylene glycol monomethyl ether | 44.23 parts by mass |

<Coating Composition 3 for Forming High Refractive Index Layer>

| | |
|---|---|
| Dispersion liquid of ITO fine particles in ethanol (solid content 20.5% by weight) | 20 parts by mass |
| PETA (trade name "KAYARAD PET-30" manufactured by Nippon Kayaku Co., Ltd., solid content 100%) | 1 part by mass |
| ITO dispersion aid (phosphate-based) | 0.1 parts by mass |
| Photopolymerization initiator (trade name "Omnirad 184" manufactured by IGM Resins B.V.) | 0.2 parts by mass |
| Ethanol | (the amount of addition was adjusted so that the solid content concentration was 4% by mass) |

A coating composition for forming a low refractive index layer having the following formulation was produced.

<Coating Composition 1 for Forming Low Refractive Index Layer>

The followings were used for hollow silica particles and non-hollow silica particles. Table 1 and Table 2 each represent the respective amounts (solid contents) of hollow silica particles and non-hollow silica particles (solid silica particles) compounded, in terms of parts by mass, under the assumption that that (solid content) of the binder resin was defined to be 100 parts by mass.

(1) Hollow Silica Particles

Dispersion liquid, solid content 20% by mass, surface-treated with silane coupling agent having methacryloyl group, average particle size 75 nm (2) Non-Hollow Silica Particles Dispersion liquid of solid silica particles, solid content 40% by mass, surface-treated with silane coupling agent having methacryloyl group, average particle size 7 nm or 12.5 nm The followings were used for the binder resin. Table 1 and Table 2 each show the proportion of the solid content.

(3) Binder Resin

TEGDA: polyethylene glycol (n≅4) diacrylate (bifunctional acrylate), trade name "M-240" manufactured by Toagosei Co., Ltd.

PETA: pentaerythritol (tri/tetra)acrylate, trade name "KAYARAD PET-30" manufactured by Nippon Kayaku Co., Ltd.

DPHA: dipentaerythritol (hexa/penta)acrylate, trade name "KAYARAD DPHA" manufactured by Nippon Kayaku Co., Ltd.

Fluorine-containing compound: fluorine-containing compound containing (meth)acryloyl group, silane unit having reactivity, and silane unit containing perfluoropolyether group, solid content 20% by mass, solvent: methyl isobutyl ketone, trade name "X-71-1203M" manufactured by Shin-Etsu Chemical Co., Ltd.

The followings were used for a photopolymerization initiator and a leveling agent. Table 1 and Table 2 each show the proportion of the solid content under the assumption that that (solid content) of the binder resin was defined to be 100 parts by mass.

(4) Photopolymerization Initiator trade name "Omnirad 127" manufactured by IGM Resins B.V. 4.3 parts by mass (5) Leveling Agent (a) Silicone-Based (Si-based-1) Leveling Agent: trade name "KP-420" manufactured by Shin-Etsu Chemical Co., Ltd. 13 parts by mass (b) Fluorine-Based Leveling Agent 1 (F-based-1): trade name "X-71-1203M" manufactured by Shin-Etsu Chemical Co., Ltd. 13 parts by mass (c) Fluorine-Based Leveling Agent 2 (F-based-2): trade name "Megaface RS-81" manufactured by DIC Corporation 5 parts by mass Methyl isobutyl ketone and 1-methoxy-2-propyl acetate were used for the solvent in each of Examples 1 to 8 and Comparative Examples 1 to 2. The mixing ratio was as follows: methyl isobutyl ketone/1-methoxy-2-propyl acetate=68/32 (mass ratio). The amount of such a mixed solvent compounded to 100 parts by mass of the binder resin (solid content) was 14,867 parts by mass.

Methyl isobutyl ketone and 2-methoxy-1-methylethyl acetate were used for the solvent in each of Comparative Examples 3 to 4. The mixing ratio was as follows: methyl isobutyl ketone/2-methoxy-1-methylethyl acetate=89/11 (mass ratio). The amount of such a mixed solvent compounded to 100 parts by mass of the binder resin (solid content) was 8,667 parts by mass.

<Coating Composition 2 for Forming Low Refractive Index Layer>

The followings were used for hollow silica particles and non-hollow silica particles. Table 2 shows the respective amounts (solid contents) of hollow silica particles and non-hollow silica particles (solid silica particles) compounded, in terms of parts by mass, under the assumption that that (solid content) of the binder resin was defined to be 100 parts by mass.

(1) Hollow Silica Particles

Dispersion liquid, solid content 20% by mass, surface-treated with silane coupling agent having methacryloyl group, average particle size 55 nm (2) Non-Hollow Silica Particles Dispersion liquid of solid silica particles, solid content 30% by mass, surface-treated with silane coupling agent having methacryloyl group, average particle size 12.5 nm The followings were used for the binder resin. Table 2 shows the proportion of the solid content.

(3) Binder Resin

PETA: pentaerythritol (tri/tetra)acrylate, trade name "KAYARAD PET-30" manufactured by Nippon Kayaku Co., Ltd.

DPHA: dipentaerythritol (hexa/penta)acrylate, trade name "KAYARAD DPHA" manufactured by Nippon Kayaku Co., Ltd.

The followings were used for a photopolymerization initiator and a leveling agent. Table 2 shows the proportion of the solid content under the assumption that that (solid content) of the binder resin was defined to be 100 parts by mass.

(4) Photopolymerization Initiator trade name "Omnirad 127" manufactured by IGM Resins B.V. 10 parts by mass (5) Leveling Agent (a) Silicone-Based (Si-based-2) Leveling Agent: trade name "X-22-164E" manufactured by Shin-Etsu Chemical Co., Ltd. 10 parts by mass Methyl isobutyl ketone and propylene glycol monomethyl ether were used for the solvent. The mixing ratio was as follows: methyl isobutyl ketone/propylene glycol monomethyl ether=60/40 (mass ratio). The amount of such a mixed solvent compounded to 100 parts by mass of the binder resin (solid content) was 5,000 parts by mass.

<Coating Composition 3 for Forming Low Refractive Index Layer>

The followings were used for hollow silica particles and non-hollow silica particles. Table 2 shows the respective amounts (solid contents) of hollow silica particles and non-hollow silica particles (solid silica particles) compounded, in terms of parts by mass, under the assumption that that (solid content) of the binder resin was defined to be 100 parts by mass.

(1) Hollow Silica Particles

Dispersion liquid in isopropyl alcohol, solid content 20% by mass, refractive index 1.30, average particle size 60 nm (2) Non-Hollow Silica Particles Dispersion liquid of spherical silica sol (solid silica particles), solid content 25% by mass, in isopropyl alcohol, surface-treated with silane coupling agent having methacryloyl group, average particle size 10.5 nm (3) Film Component The following reactive silane was used for a raw material of a film component ($SiO_2$).

3-Methacryloxypropyltrimethoxysilane

The following was used for a photopolymerization initiator. Table 2 shows the proportion of the solid content under the assumption that that (solid content) of the binder resin was defined to be 100 parts by mass.

(4) Photopolymerization Initiator trade name "Omnirad 369" manufactured by IGM Resins B.V. 8.9 parts by mass Coating composition 3 for forming a low refractive index layer was produced by the following steps.

First, the dispersion liquid of hollow silica particles, the dispersion liquid of non-hollow silica particles, and isopropyl alcohol were mixed at a proportion of 20/8/25 (mass ratio), and thus a dispersion liquid of silica particles was obtained.

Reactive silane (3-methacryloxypropyltrimethoxysilane) was dropped into the dispersion liquid of silica particles, and mixed. The mixing ratio was as follows: reactive silane: dispersion liquid of silica particles=100:1432 (mass ratio). While the mixed liquid was stirred, an aqueous 0.4 M nitric acid solution was dropped, and the reactive silane was hydrolyzed. The photopolymerization initiator and the solvent (isopropyl alcohol) were added to the mixed liquid after such hydrolysis, the resultant was mixed, and thus coating composition 3 for forming a low refractive index layer (solid content concentration 3.5% by mass) was obtained.

Examples 1, 4 to 7 and Comparative Examples 1 to 2

The coating composition 1 for forming a hardcoat layer having the aforementioned formulation was coated on an acrylic film (refractive index 1.50) having a thickness of 80 μm, and thereafter dried at 70° C. for 1 minute to thereby volatilize the solvent. Subsequently, the resultant was irradiated with an ultraviolet ray (100 mJ/cm$^2$), and thus a hardcoat layer (dry thickness 10 μm) was formed.

The coating composition 1 for forming a high refractive index layer having the aforementioned formulation was coated on the hardcoat layer, and thereafter dried at 70° C. for 1 minute to thereby volatilize the solvent. Subsequently, the resultant was irradiated with an ultraviolet ray (100 mJ/cm$^2$), and thus a high refractive index layer was formed (dry thickness 150 nm).

The coating composition 1 for forming a low refractive index layer formulated as shown in Table 1 and Table 2 was coated on the high refractive index layer, and thereafter dried at 60° C. for 1 minute to thereby volatilize the solvent. Subsequently, the resultant was irradiated with an ultraviolet ray (200 mJ/cm$^2$), thus a low refractive index layer (dry thickness 100 nm) was formed, and thus each antireflection member of Examples 1, 4 to 7 and Comparative Examples 1 to 2 was obtained.

Example 2

An antireflection member of Example 2 was obtained by forming each layer in the same conditions as in Example 1 except that drying conditions after coating the coating composition 1 for forming a low refractive index layer were 50° C. and 1 minute.

Example 3

An antireflection member of Example 3 was obtained by forming each layer in the same conditions as in Example 1 except that drying conditions after coating the coating composition 1 for forming a low refractive index layer were 100° C. and 1 minute.

Example 8

An antireflection member of Example 8 was obtained by forming each layer in the same conditions as in Example 1 except that no high refractive index layer was formed.

Comparative Example 3

The coating composition 1 for forming a hardcoat layer having the aforementioned formulation was coated on an acrylic film (refractive index 1.50) having a thickness of 80 μm, and thereafter dried at 70° C. for 1 minute to thereby volatilize the solvent. Subsequently, the resultant was irradiated with an ultraviolet ray (100 mJ/cm$^2$), and thus a hardcoat layer (dry thickness 10 μm) was formed.

The coating composition 2 for forming a high refractive index layer having the aforementioned formulation was coated on the hardcoat layer, and thereafter dried at 70° C. for 1 minute to thereby volatilize the solvent. Subsequently, the resultant was irradiated with an ultraviolet ray (100 mJ/cm$^2$), and thus a high refractive index layer (dry thickness 150 nm) was formed.

The coating composition 1 for forming a low refractive index layer formulated as shown in Table 2 was coated on the high refractive index layer, and thereafter dried at 60° C. for 1 minute to thereby volatilize the solvent. Subsequently, the resultant was irradiated with an ultraviolet ray (200 mJ/cm$^2$), thus a low refractive index layer (dry thickness 100 nm) was formed, and thus an antireflection member of Comparative Example 3 was obtained.

Comparative Example 4

An antireflection member of Comparative Example 4 was obtained by forming each layer in the same conditions as in Comparative Example 3 except that no high refractive index layer was formed.

Comparative Example 5

The coating composition 2 for forming a hardcoat layer having the aforementioned formulation was coated on an acrylic film (refractive index 1.50) having a thickness of 80 μm, and thereafter dried at 70° C. for 1 minute to thereby volatilize the solvent. Subsequently, the resultant was irradiated with an ultraviolet ray (50 mJ/cm$^2$), and thus a hardcoat layer (dry thickness 12 μm) was formed.

The coating composition 2 for forming a low refractive index layer having the aforementioned formulation was coated on the hardcoat layer, and thereafter dried at 70° C. for 1 minute to thereby volatilize the solvent. Subsequently, the resultant was irradiated with an ultraviolet ray (200 mJ/cm$^2$), and thus a high refractive index layer (dry thickness 100 nm) was formed.

The coating composition 2 for forming a low refractive index layer having the aforementioned formulation was coated on the high refractive index layer, and thereafter dried at 60° C. for 1 minute to thereby volatilize the solvent. Subsequently, the resultant was irradiated with an ultraviolet ray (200 mJ/cm$^2$), thus a low refractive index layer (dry thickness 100 nm) was formed, and thus an antireflection member of Comparative Example 5 was obtained.

Comparative Example 6

The coating composition 1 for forming a hardcoat layer having the aforementioned formulation was coated on an acrylic film (refractive index 1.50) having a thickness of 80 μm, and thereafter dried at 70° C. for 1 minute to thereby volatilize the solvent. Subsequently, the resultant was irradiated with an ultraviolet ray (100 mJ/cm$^2$), and thus a hardcoat layer (dry thickness 10 μm) was formed.

The coating composition 3 for forming a high refractive index layer having the aforementioned formulation was coated on the hardcoat layer, and thereafter dried at 70° C. for 2 minutes to thereby volatilize the solvent. Subsequently, the resultant was irradiated with an ultraviolet ray (100 mJ/cm$^2$), and thus a high refractive index layer (dry thickness 100 nm) was formed.

The coating composition 3 for forming a low refractive index layer having the aforementioned formulation was coated on the high refractive index layer, and thereafter dried at 60° C. for 1 minute to thereby volatilize the solvent. Subsequently, the resultant was irradiated with an ultraviolet ray (200 mJ/cm$^2$), and thus a low refractive index layer (dry thickness 105 nm) was formed.

Subsequently, "Optool DSX-E (registered trademark)" manufactured by Daikin Industries Ltd. was diluted with "Demnum Solvent SOL-1" manufactured by Daikin Industries Ltd. to obtain a 0.1% by weight solution. The low refractive index layer was coated with the solution by use of a bar coater, the resultant was heated at 120° C. for 1 minute, a covering layer having a thickness of about 2 nm was formed, and thus an antireflection member of Comparative Example 6 was obtained.

Comparative Example 7

For Comparative Example 7, commercially available MacBook Pro (15 inches, 2016 model) manufactured by Apple Inc. was disassembled, and an antireflection member was taken out. A surface of the antireflection member (surface facing a user) was appropriately cut to an evaluation/measurement size, and evaluated and measured according to 1-2 to 1-6.

TABLE 1

| | | Example 1 | Example 2 | Example 3 | Example 4 | Example 5 |
|---|---|---|---|---|---|---|
| Binder resin in low refractive index layer | Composition | TEGDA | TEGDA | TEGDA | TEGDA | TEGDA |
| | Amount compounded (parts by mass) | 100 | 100 | 100 | 100 | 100 |
| Hollow silica particles | Amount compounded (parts by mass) | 200 | 200 | 200 | 200 | 200 |
| | Particle size (nm) | 75 | 75 | 75 | 75 | 75 |
| Solid silica particles | Amount compounded (parts by mass) | 117 | 117 | 117 | 117 | 117 |
| | Particle size (nm) | 12.5 | 12.5 | 12.5 | 7 | 12.5 |
| Particle size ratio | | 0.17 | 0.17 | 0.17 | 0.09 | 0.17 |
| Leveling agent in low refractive index layer | | Si-based | Si-based | Si-based | Si-based | F-based-1 |
| Drying temperature (° C.) of low refractive index layer | | 60 | 50 | 100 | 60 | 60 |
| Refractive index | Low refractive index layer | 1.33 | 1.33 | 1.33 | 1.33 | 1.33 |
| | High refractive index layer | 1.65 | 1.65 | 1.65 | 1.65 | 1.65 |
| | Hardcoat layer | 1.57 | 1.57 | 1.57 | 1.57 | 1.57 |
| Reflectance (luminous reflectance Y value) | | 0.3 | 0.3 | 0.3 | 0.3 | 0.3 |
| Element ratio | Inorganic Si (atomic %) | 13.5 | 16.8 | 11.1 | 11.4 | 10.8 |
| | C(atomic %) | 41.2 | 34.2 | 40.7 | 39.9 | 39.8 |
| | F(atomic %) | (Not detected) | (Not detected) | (Not detected) | (Not detected) | 30.8 |
| | Other (atomic %) | 45.3 | 49.0 | 48.2 | 48.7 | 18.6 |
| | C/Si (%) | 305.2 | 203.6 | 366.7 | 350.0 | 368.5 |
| Surface roughness | Rz (nm) | 50.47 | 49.80 | 61.92 | 62.38 | 59.81 |
| | Ra(nm) | 6.03 | 6.12 | 6.21 | 6.66 | 6.12 |
| | Rz/Ra | 8.38 | 8.14 | 9.97 | 9.37 | 9.77 |
| Steel wool resistance (g/cm$^2$) | Under fluorescent lamp | 1500 | 1500 | 1200 | 1200 | 1000 |
| | Under LED | 1000 | 1000 | 900 | 900 | 700 |
| Oil dust resistance (g/cm$^2$) | Under fluorescent lamp | 1500 | 1500 | 1200 | 1200 | 800 |
| | Under LED | 1000 | 1000 | 900 | 900 | 500 |
| Antifouling properties | | A | A | A | A | A |
| Nanoindentation hardness (MPa) | | 699.7 | — | — | — | — |
| Recovery rate (%) | | 85.6 | — | — | — | — |

| | | Example 6 | | Example 7 | | Example 8 |
|---|---|---|---|---|---|---|
| Binder resin in low refractive index layer | Composition | TEGDA | PETA | TEGDA | PETA | TEGDA |
| | Amount compounded (parts by mass) | 80 | 20 | 60 | 40 | 100 |
| Hollow silica particles | Amount compounded (parts by mass) | 200 | | 200 | | 200 |
| | Particle size (nm) | 75 | | 75 | | 75 |
| Solid silica particles | Amount compounded (parts by mass) | 117 | | 117 | | 117 |
| | Particle size (nm) | 12.5 | | 12.5 | | 12.5 |
| Particle size ratio | | 0.17 | | 0.17 | | 0.17 |
| Leveling agent in low refractive index layer | | Si-based | | Si-based | | Si-based |
| Drying temperature (° C.) of low refractive index layer | | 60 | | 60 | | 60 |
| Refractive index | Low refractive index layer | 1.33 | | 1.33 | | 1.33 |
| | High refractive index layer | 1.65 | | 1.65 | | — |
| | Hardcoat layer | 1.57 | | 1.57 | | 1.57 |
| Reflectance (luminous reflectance Y value) | | 0.3 | | 0.3 | | 0.5 |
| Element ratio | Inorganic Si (atomic %) | 10.9 | | 10.3 | | 14.7 |
| | C(atomic %) | 40.1 | | 41.0 | | 34.1 |
| | F(atomic %) | (Not detected) | | (Not detected) | | (Not detected) |
| | Other (atomic %) | 49.0 | | 48.7 | | 51.2 |
| | C/Si (%) | 367.9 | | 398.1 | | 232.0 |
| Surface roughness | Rz (nm) | 66.24 | | 67.98 | | 50.01 |
| | Ra(nm) | 6.23 | | 6.38 | | 6.19 |
| | Rz/Ra | 10.63 | | 10.66 | | 8.08 |

TABLE 1-continued

|  |  |  |  |  |
|---|---|---|---|---|
| Steel wool resistance (g/cm²) | Under fluorescent lamp | 900 | 800 | 1500 |
|  | Under LED | 600 | 500 | 1000 |
| Oil dust resistance (g/cm²) | Under fluorescent lamp | 750 | 700 | 1500 |
|  | Under LED | 450 | 400 | 1000 |
| Antifouling properties |  | A | A | A |
| Nanoindentation hardness (MPa) |  | 790.3 | — | 481.4 |
| Recovery rate (%) |  | 82.9 | — | 83.2 |

TABLE 2

|  |  | Comp. Ex. 1 |  | Comp. Ex. 2 |  | Comp. Ex. 3 |  | Comp. Ex. 4 |  |
|---|---|---|---|---|---|---|---|---|---|
| Binder resin in low refractive index layer | Composition | PETA | DPHA | PETA | DPHA | PETA | Fluorine-containing compound | PETA | Fluorine-containing compound |
|  | Amount compounded (parts by mass) | 50 | 50 | 50 | 50 | 70 | 30 | 30 | 70 |
| Hollow silica particles | Amount compounded (parts by mass) | 200 |  | 200 |  | 135 |  | 130 |  |
|  | Particle size (nm) | 75 |  | 75 |  | 75 |  | 75 |  |
| Solid silica particles | Amount compounded (parts by mass) | 117 |  | 117 |  | 10 |  | 10 |  |
|  | Particle size (nm) | 12.5 |  | 12.5 |  | 12.5 |  | 12.5 |  |
| Particle size ratio |  | 0.17 |  | 0.17 |  | 0.17 |  | 0.17 |  |
| Leveling agent in low refractive index layer |  | Si-based |  | F-based-1 |  | F-based-2 |  | F-based-2 |  |
| Drying temperature (° C.) of low refractive index layer |  | 60 |  | 60 |  | 60 |  | 60 |  |
| Refractive index | Low refractive index layer | 1.33 |  | 1.33 |  | 1.33 |  | 1.33 |  |
|  | High refractive index layer | 1.65 |  | 1.65 |  | 1.65 |  | — |  |
|  | Hardcoat layer | 1.57 |  | 1.57 |  | 1.57 |  | 1.57 |  |
| Reflectance (luminous reflectance Y value) |  | 0.3 |  | 0.3 |  | 0.3 |  | 0.5 |  |
| Element ratio | Inorganic Si (atomic %) | 9.3 |  | 8.2 |  | 5.7 |  | 5.3 |  |
|  | C(atomic %) | 42.1 |  | 32.7 |  | 36.4 |  | 39.5 |  |
|  | F(atomic %) | (Not detected) |  | 31.3 |  | 33.4 |  | 32.1 |  |
|  | Other (atomic %) | 48.6 |  | 27.8 |  | 24.5 |  | 23.1 |  |
|  | C/Si (%) | 452.7 |  | 398.8 |  | 638.6 |  | 745.3 |  |
| Surface roughness | Rz (nm) | 67.19 |  | 65.06 |  | 67.70 |  | 84.87 |  |
|  | Ra(nm) | 6.02 |  | 6.02 |  | 4.75 |  | 6.59 |  |
|  | Rz/Ra | 11.17 |  | 10.32 |  | 14.26 |  | 12.88 |  |
| Steel wool resistance (g/cm²) | Under fluorescent lamp | 600 |  | 500 |  | 300 |  | 300 |  |
|  | Under LED | ≤200 |  | ≤200 |  | ≤200 |  | ≤200 |  |
| Oil dust resistance (g/cm²) | Under fluorescent lamp | 600 |  | 500 |  | 200 |  | 200 |  |
|  | Under LED | ≤100 |  | ≤100 |  | ≤100 |  | ≤100 |  |
| Antifouling properties |  | A |  | A |  | A |  | A |  |
| Nanoindentation hardness (MPa) |  | 843.8 |  | — |  | 476.9 |  | 392.6 |  |
| Recovery rate (%) |  | 83.7 |  | — |  | 77.5 |  | 71.9 |  |

|  |  | Comp. Ex. 5 |  | Comp. Ex. 6 | Comp. Ex. 7 |
|---|---|---|---|---|---|
| Binder resin in low refractive index layer | Composition | PETA | DPHA | 3-Methacryloxypropyl trimethoxysilane | — |
|  | Amount compounded (parts by mass) | 50 | 50 | 100 | — |
| Hollow silica particles | Amount compounded (parts by mass) | 160 |  | 108 | — |
|  | Particle size (nm) | 55 |  | 60 | — |
| Solid silica particles | Amount compounded (parts by mass) | 30 |  | 54 | — |
|  | Particle size (nm) | 12.5 |  | 10.5 | — |
| Particle size ratio |  | 0.23 |  | 0.18 | — |
| Leveling agent in low refractive index layer |  | Si-based-2 |  | — | — |
| Drying temperature (° C.) of low refractive index layer |  | 25→70 |  | 60 | — |
| Refractive index | Low refractive index layer | 1.38 |  | 1.38 | — |
|  | High refractive index layer | — |  | 1.65 | — |
|  | Hardcoat layer | 1.50 |  | 1.53 | — |
| Reflectance (luminous reflectance Y value) |  | 1.4 |  | 0.4 | — |
| Element ratio | Inorganic Si (atomic %) | — |  | — | 14.8 |
|  | C(atomic %) | — |  | — | 20.4 |
|  | F(atomic %) | — |  | — | 36.6 |
|  | Other (atomic %) | — |  | — | 28.2 |
|  | C/Si (%) | — |  | — | 137.8 |
| Surface roughness | Rz (nm) | — |  | — | 64.80 |
|  | Ra(nm) | — |  | — | 8.57 |
|  | Rz/Ra | — |  | — | 7.56 |
| Steel wool resistance (g/cm²) | Under fluorescent lamp | 200 |  | 500 | 1500 |
|  | Under LED | ≤200 |  | ≤200 | ≤200 |
| Oil dust resistance (g/cm²) | Under fluorescent lamp | ≤200 |  | ≤200 | 1500 |
|  | Under LED | ≤100 |  | ≤100 | ≤100 |
| Antifouling properties |  | B |  | A | A |
| Nanoindentation hardness (MPa) |  | — |  | — | — |
| Recovery rate (%) |  | — |  | — | — |

It could be confirmed from the results of Table 1 that each of the antireflection members of Examples 1 to 8, in which the ratio of Si element was 10.0 atomic percent or more and 18.0 atomic percent or less and the ratio of C element under the assumption that the ratio of Si element is defined to be 100 atomic percent (C/Si) was 180 atomic percent or more and 500 atomic percent or less, was favorable in scratch resistance such as steel wool resistance and oil dust resistance. As shown in FIG. 3, the antireflection member of Example 1 included the hollow silica particles and the non-hollow silica particles uniformly dispersed in the low refractive index layer.

On the contrary, as shown in Table 2, all the antireflection members of Comparative Examples 1 to 7 had the ratio of Si element and C/Si not satisfying the aforementioned respective ranges, and were inferior in scratch resistance such as steel wool resistance and oil dust resistance. The hollow silica particles were exposed on a surface in the low refractive index layer in the antireflection member of Comparative Example 2 shown in FIG. 4. It is considered that steel wool and sand of oil dust easily enter into gaps between the hollow silica particles, and thus scratch resistance was deteriorated. The non-hollow silica particles were exposed on a surface in the low refractive index layer in the antireflection member of Comparative Example 5 shown in FIG. 5. It is considered that the non-hollow silica particles were easily detached from the film by scratches, and thus scratch resistance was deteriorated.

Although not shown in the Tables, equivalent scratch resistance can be obtained for an antireflection member in which the ratio of Si element and C/Si fall within the aforementioned ranges by changing the composition of the binder in the low refractive index layer from Examples 1 to 8 (for example, mixture of ditrimethylolpropane tetraacrylate/trimethylolpropane PO-modified (n≅2) triacrylate=23/77) and adjusting the type of the solvent and the drying temperature.

Examples 9 to 12

The steel wool resistance test and the oil dust resistance test were performed using the same antireflection member as in Example 1 under the test environment changed as described in Table 3. Other test conditions were the same as conditions described in 1-4 and 1-5.

TABLE 3

| | | Example 1 | Example 9 | Example 10 | Example 11 | Example 12 |
| --- | --- | --- | --- | --- | --- | --- |
| Test environment | Temperature (° C.) | 23 ± 1 | 16 ± 1 | 16 ± 1 | 30 ± 1 | 30 ± 1 |
| | Relative temperature (%) | 50 ± 5 | 30 ± 5 | 70 ± 5 | 30 ± 5 | 70 ± 5 |
| Steel wool resistance ($g/cm^2$) | Under fluorescent lamp | 1500 | 1500 | 1500 | 1500 | 1500 |
| | Under LED | 1000 | 1000 | 1000 | 1000 | 1000 |
| Oil dust resistance ($g/cm^2$) | Under fluorescent lamp | 1500 | 1500 | 1500 | 1500 | 1500 |
| | Under LED | 1000 | 1000 | 1000 | 1000 | 1000 |

An environment at a temperature of 16 to 30° C. and a relative humidity of 30 to 70% corresponds to a common use environment of an image display device comprising an antireflection member. It can be understood from the results of Table 3 that the antireflection member of the present invention is almost not changed in steel wool resistance and oil dust resistance even in different use environments.

REFERENCE SIGNS LIST 100,200 antireflection member
110 transparent substrate
120 hardcoat layer
130 low refractive index layer
132 hollow silica particle
134 non-hollow silica particle
140 high refractive index layer
142 high refractive index fine particle

The invention claimed is:

1. An antireflection member comprising a low refractive index layer on a transparent substrate, wherein
   the low refractive index layer comprises a binder resin and silica particles,
   the binder resin comprises a cured product of an ionizing radiation-curable resin composition and the ionizing radiation-curable resin composition contains an alkylene oxide-modified (meth)acrylate-based compound,
   the silica particles include hollow silica particles and non-hollow silica particles, and a content of the non-hollow silica particles is 90 parts by mass or more and 200 parts by mass or less based on 100 parts by mass of the binder resin,
   a ratio of Si element attributed to the silica particles, obtained by analysis of a surface region of the low refractive index layer by X-ray photoelectron spectroscopy, is 10.0 atomic percent or more and 18.0 atomic percent or less and a ratio of C element under the assumption that the ratio of Si element is defined to be 100 atomic percent is 180 atomic percent or more and 500 atomic percent or less, and
   when the thickness of the low refractive index layer is trisected and regions obtained are defined as a first region, a second region and a third region sequentially closer to the transparent substrate, at an arbitrary point in the first region and an arbitrary point in the second region, the ratio of Si element attributed to the silica particles is 10.0 atomic percent or more and 18.0 atomic percent or less and the ratio of C element under the assumption that the ratio of Si element is defined to be 100 atomic percent is 180 atomic percent or more and 500 atomic percent or less.

2. The antireflection member according to claim 1, wherein a ratio of an average particle size of the non-hollow silica particles to an average particle size of the hollow silica particles is 0.29 or less.

3. The antireflection member according to claim 1, wherein the hollow silica particles have an average particle size of 50 nm or more and 100 nm or less and the non-hollow silica particles have an average particle size of 5 nm or more and 20 nm or less.

4. The antireflection member according to claim 1, wherein surfaces of the hollow silica particles and non-hollow silica particles are coated with a silane coupling agent.

5. The antireflection member according to claim 1, wherein the surface region of the low refractive index layer contains substantially no fluorine atom.

6. The antireflection member according to claim 1, wherein the low refractive index layer has an indentation hardness of 480 MPa or more according to a nanoindentation method.

7. The antireflection member according to claim 1, wherein the low refractive index layer has a recovery rate of 80% or more according to a nanoindentation method.

8. The antireflection member according to claim 1, wherein Rz/Ra is 22.0 or less where Rz represents a maximum height roughness of the low refractive index layer surface and Ra represents an arithmetic average roughness of the low refractive index layer surface.

9. A polarizing plate comprising a transparent protection plate, a polarizer and a transparent protection plate in the listed order, wherein at least one of the two transparent protection plates is the antireflection member according to claim 1.

10. An image display device comprising the antireflection member according to claim 1, on a display element.

11. An antireflective article comprising the antireflection member according to claim 1, on a member.

\* \* \* \* \*